(12) United States Patent
Yun et al.

(10) Patent No.: US 7,547,938 B2
(45) Date of Patent: Jun. 16, 2009

(54) SEMICONDUCTOR DEVICES HAVING ELONGATED CONTACT PLUGS

(75) Inventors: Cheol-ju Yun, Gyeonggi-do (KR); Tae-young Chung, Gyeonggi-do (KR); Dong-jun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/954,349

(22) Filed: Dec. 12, 2007

(65) Prior Publication Data

US 2008/0088025 A1 Apr. 17, 2008

Related U.S. Application Data

(62) Division of application No. 11/096,129, filed on Mar. 31, 2005, now Pat. No. 7,326,613.

(30) Foreign Application Priority Data

Apr. 2, 2004 (KR) ............... 10-2004-0022737

(51) Int. Cl.
*H01L 27/108* (2006.01)
*H01L 29/94* (2006.01)
(52) U.S. Cl. ............... 257/303; 257/306; 257/758
(58) Field of Classification Search .......... 257/303, 257/306, 758
See application file for complete search history.

(56) References Cited

U.S. PATENT DOCUMENTS 5,248,628 A 9/1993 Okabe et al.
5,622,883 A 4/1997 Kim
6,472,268 B1 10/2002 Yoo
6,586,794 B2 7/2003 Nakamura et al.
6,713,337 B2 3/2004 Takahashi
6,794,757 B1 9/2004 Smith
7,030,439 B2 * 4/2006 Yun et al. ............... 257/296

FOREIGN PATENT DOCUMENTS

KR 10-2000-0013396 3/2000
KR 10-2003-0023970 3/2003
KR 10-2003-0041550 5/2003

OTHER PUBLICATIONS

Notice to Submit a Response for Korean Application No. 10-2004-0022737, Dec. 9, 2005.

* cited by examiner

*Primary Examiner*—Phat X Cao
(74) *Attorney, Agent, or Firm*—Myers Bigel Sibley & Sajovec, P.A.

(57) ABSTRACT

A method of manufacturing a semiconductor device includes forming conductive structures on a substrate. Each of the conductive structures has a line shape that extends along a first direction parallel to the substrate. Insulating spacers are formed on upper sidewalls of the conductive structures. An insulating interlayer is formed that covers the conductive structures. A portion of the insulating interlayer between the conductive structures is etched to form a contact hole. An upper portion of the contact hole is larger than a lower portion thereof. The upper portion of the contact hole has a first width along the first direction and a second width along a second direction parallel to the substrate and substantially perpendicular to the first direction. The first width is substantially larger than the second width. The contact hole is filled with a conductive material to form a contact plug.

13 Claims, 28 Drawing Sheets

SEMICONDUCTOR DEVICES HAVING ELONGATED CONTACT PLUGS

CROSS REFERENCE TO RELATED APPLICATIONS

This application is a divisional of U.S. application Ser. No. 11/096,129, filed Mar. 31, 2005, now U.S. Pat. No. 7,326,613 and claims priority under 35 USC §119 to Korean Patent Application No. 10-2004-0022737 filed on Apr. 2, 2004, the contents of which are herein incorporated by reference in their entirety.

FIELD OF THE INVENTION

The present invention relates to semiconductor devices and methods of manufacturing semiconductor devices. More particularly, the present invention relates to semiconductor devices that include capacitors formed on storage node contacts between bit line structures, and associated methods of manufacturing semiconductor devices.

BACKGROUND OF THE INVENTION

Semiconductor manufacturing technologies continue to evolve in order to provide memory devices having increasingly higher storage capacity, integration density, and response speed. Dynamic random access memory (DRAM) devices are most widely used as memory for electric and electronic apparatuses because such devices can have high storage capacity and integration density. A DRAM device memory cell typically includes one access transistor and one storage capacitor.

As the integration density of a DRAM device memory cell increases, the memory cell generally occupies less area on a semiconductor substrate. With less area, capacitors in the memory cells can need higher capacitance characteristics.

The capacitance of a capacitor can be increased by using a dielectric material that has a higher dielectric constant as a dielectric layer in the capacitor, or the surface area of the capacitor can be increased. Some high dielectric material that have been considered for use in the dielectric layer of the capacitor include $Al_2O_3$, $Ta_2O_5$, or $HfO_2$. However, forming a capacitor with a high dielectric material in a dielectric layer can be complex because of process variations that can occur during manufacturing. To increase the surface area of a capacitor, stacked, trench, and cylindrical type capacitors have been substituted for planar type capacitors.

In the DRAM device, the capacitors should be electrically connected to source/drain regions of a semiconductor substrate. Consequently, the locations of the capacitors are limited by the locations of the source/drain regions. When the spacing between adjacent capacitors becomes narrow, an electrical short between capacitors may occur more frequently. A landing pad electrode can be formed on a storage node contact to increase the spacing between adjacent capacitors. However, additional processes that include deposition process and photolithography process can be needed to form the landing pad electrodes. Moreover, a very small photoresist pattern may need to be formed to form the landing pad electrode. An argon fluoride laser having a relatively short wavelength may be used in the photolithography process with the photoresist pattern, however the associated manufacturing cost may thereby increase.

As the integration degree of memory cells in the DRAM devices increases, the separation between contacts and other wirings can become narrower and the resulting parasitic capacitance therebetween can increase. Increased parasitic capacitance can cause increased operation failures and deterioration of the operating speed of the DRAM devices.

SUMMARY OF THE INVENTION

In some embodiments of the present invention, a semiconductor device includes a substrate, conductive structures on the substrate, insulating spacers, an insulation structure on the conductive structures, and contact plugs. Each of the conductive structures has a line shape along a first direction parallel to the substrate. The insulating spacers partially cover upper sidewalls of the conductive structures. The insulating spacers are between at least a portion of the insulating structure and the conductive structures. The contact plugs are between adjacent pairs of the conductive structures, and extend from an upper surface of the insulating structure through the insulating structure to electrically connect to a portion of the substrate. An upper portion of each of the contact plugs is substantially larger than a lower portion thereof. An upper face of each of the contact plugs has a first width along the first direction and a second width along a second direction parallel to the substrate and substantially perpendicular to the first direction, and the first width is substantially larger than the second width.

In some further embodiments, each of the conductive structures can include a conductive layer pattern and a capping layer pattern on the conductive layer pattern opposite to the substrate. The conductive layer pattern can include metal. The insulation structure can include an insulation layer pattern and an insulating interlayer. The insulation layer pattern can partially cover lower sidewalls of the conductive structures, and can be between the insulating spacers and the substrate. The insulating interlayer can be on the insulation layer pattern, and can completely cover sidewalls of the conductive structures. The insulation layer pattern can include a material having a lower dielectric constant than that of the insulating spacers. The insulation layer pattern can include silicon oxide, and the insulating spacers can include silicon nitride.

In some embodiments of the present invention, a semiconductor device includes a substrate, a first insulating interlayer, bit line structures, insulating spacers, an insulation structure on the conductive structures, storage node contacts, and capacitors. The substrate has active patterns that are defined therein. The first insulating interlayer is on the substrate. The bit line structures are on the first insulating interlayer, and the bit line structures extend along a first direction parallel to the substrate. The insulating spacers partially cover upper sidewalls of the bit line structures. The insulation structure is on the bit line structures. The insulating spacers are between at least a portion of the insulation structure and the conductive structures. The storage node contacts are between adjacent pairs of the bit line structures. Each of the storage node contacts extends from an upper surface of the insulating structure through the insulating structure to be electrically connected to the active patterns in the substrate. An upper portion of each of the storage node contacts is substantially larger than a lower portion thereof. An upper face of each of the storage node contacts has a first width along the first direction and a second width along a second direction parallel to the substrate and substantially perpendicular to the first direction, and the first width is substantially larger than the second width. The capacitors are each on a portion of the upper face of each of the storage node contacts.

In some further embodiments, the insulation structure can include an insulation layer pattern and an insulating interlayer. The insulation layer pattern partially covers lower sidewalls of the bit line structures, and is between the insulating spacers and the substrate. The insulating interlayer is on the insulation layer pattern. The insulation layer pattern can include a material having a lower dielectric constant than that of the insulating spacers. Each of the bit line structures can include a bit line, of a conductive material, and a capping layer pattern on the bit line. The bit line structures can include a metal. The insulating layer pattern can extend further away from the substrate than the bit line structures.

In yet some further embodiments, the semiconductor device can further include word line structures that extend along the second direction in the first insulating interlayer. Pairs of the word line structures can overlie each of the active patterns. Contact pads can extend from an upper surface of the first insulating interlayer through the first insulating layer to be electrically connected to the active patterns between the word lines. The capacitors can be arranged in a slant direction relative to the first and second directions.

Some other embodiments of the present invention provide methods of manufacturing a semiconductor device. Conductive structures are formed on a substrate. Each of the conductive structures has a line shape that extends along a first direction parallel to the substrate. Insulating spacers are formed on upper sidewalls of the conductive structures. An insulating interlayer is formed that covers the conductive structures. A portion of the insulating interlayer between the conductive structures is etched to form a contact hole. An upper portion of the contact hole is larger than a lower portion thereof. The upper portion of the contact hole has a first width along the first direction and a second width along a second direction parallel to the substrate and substantially perpendicular to the first direction. The first width is substantially larger than the second width. The contact hole is filled with a conductive material to form a contact plug.

In some further embodiments, the conductive structures are formed by forming a conductive layer on the substrate, forming a capping layer on the conductive layer opposite to the substrate, patterning the capping layer to form a capping layer pattern, and patterning the conductive layer to form a conductive layer pattern. The conductive layer pattern can include a metal. An insulation layer pattern can be formed that partially covers the sidewalls of the conductive structures before the insulating spacers are formed. The insulation layer pattern can extend substantially further away from the substrate than the conductive layer pattern.

In yet some further embodiments, the insulation layer pattern can be formed by forming a first insulation layer that completely covers the conductive structures, planarizing the first insulation layer, and partially removing the first insulation layer to expose upper sidewalls of the conductive structures. Formation of the insulation layer pattern can also include forming a first insulation layer that covers the conductive structures, and removing the first insulation layer from the upper sidewalls the conductive structures.

In yet some further embodiments, an etch stop layer can be formed on the insulation layer pattern and the upper sidewalls of the conductive structures after the insulation layer pattern is formed and before the insulating spacers are formed. Formation of the contact hole can include: forming a mask pattern on the insulating interlayer, where the mask pattern selectively exposes portions of the insulating interlayer between the conductive structures, partially removing portions of the insulating interlayer exposed through the mask pattern to form first openings, extending the size of the first openings along the first direction to form a second opening, removing the etch stop layer and the insulation layer pattern through the second opening to expose the contact pad and form a third opening, wherein a cross sectional area, parallel to the substrate, of a lower portion the third opening is substantially smaller than that of an upper portion of the second opening, and removing the mask pattern. The mask pattern may have a line shape or a contact shape. The size of the first openings can be extended along the first direction to form a second opening by etching the insulating interlayer that is exposed through the first opening. The insulation layer pattern can include a material having a dielectric constant that is lower than that of the insulating spacers.

In some embodiments of the present invention, a method of forming a semiconductor device includes providing a substrate, and defining active patterns in the substrate. A first insulating interlayer is formed on the substrate. Bit line structures are formed on the first insulating interlayer, where the bit lines structures extend along a first direction parallel to the substrate. Insulating spacers are formed that partially cover upper sidewalls of the bit line structures. An insulating interlayer is formed that covers the bit line structures. A portion of the insulating interlayer between the bit line structures is removed to form storage node contact holes. An upper portion of the storage node contact holes is larger than a lower portion thereof. The upper portion of the contact hole has a first width along the first direction and a second width along a second direction parallel to the substrate and substantially perpendicular to the first direction, and the first width is substantially larger than the second width. The storage node contact holes are filled with a conductive material to form storage node contacts. Capacitors are formed on portions of upper faces of the storage node contacts.

In some further embodiments, the bit line structures can be formed by forming a conductive layer on the substrate, forming a capping layer on the conductive layer opposite to the substrate, patterning the capping layer to form a capping layer pattern, and patterning the conductive layer to form bit lines. The bit lines can include a metal. An insulation layer pattern can be formed that partially cover lower sidewalls of the bit line structures before forming the insulating spacers. The insulation layer pattern can extend substantially further away from the substrate than the bit line structures.

In yet some further embodiments, the insulation layer pattern can be formed by forming a first insulation layer that completely covers the bit line structures, planarizing the first insulation layer, and partially removing the first insulation layer to expose upper sidewalls of the bit line structures. The insulation layer pattern can be formed by forming a first insulation layer to cover the bit line structures, and removing the first insulation layer from the upper sidewalls of the bit line structures. An etch stop layer can be formed on the insulation layer pattern and the upper sidewalls of the bit line structures after forming the insulation layer pattern and before forming the insulating spacers.

In yet some further embodiments, a portion of the insulating interlayer can be removed between the bit line structures to form storage node contact holes by a method of: forming a mask pattern on the insulation interlayer, the mask pattern selectively exposing portions of the insulating interlayer between the bit line structures; partially removing portions of the second insulating interlayer exposed through the mask pattern to form first openings; extending the size of the first openings along the first direction to form second openings; partially removing the insulation layer pattern and the etching stop layer through the second openings to form third openings, wherein a cross sectional area, parallel to the substrate, of a lower portion the third opening is substantially smaller than that of an upper portion of the second opening; removing the mask pattern; and filling the second and third openings with a conductive material. The mask pattern can have a line shape or a contact shape. The size of the first openings can be extended along the first direction to form second openings by etching the second insulating interlayer exposed through the first openings.

In yet some further embodiments, the insulation layer pattern can include a material having a dielectric constant lower than that of the insulating spacers. The insulation layer pattern can include silicon oxide, and the insulating spacers can include silicon nitride. The capacitors can be arranged in a slant direction relative to the first and second directions. Word line structures can be formed on the substrate to extend along the second direction before the insulating interlayer is formed. Contact pads can be formed between the word line structures and extend through the first insulating interlayer and be electrically connected to the active patterns.

DETAILED DESCRIPTION OF EMBODIMENTS OF THE INVENTION

Figure 1:
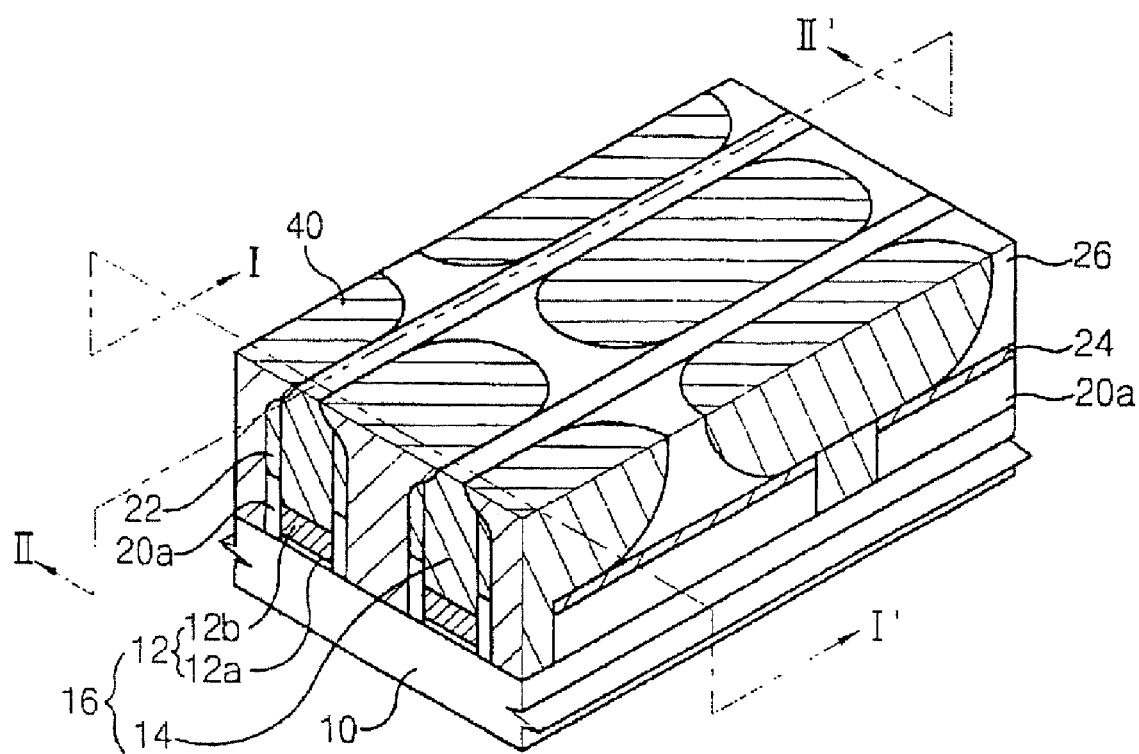
FIG. 1 is a perspective view illustrating a semiconductor device including a contact plug in accordance with some embodiments of the present invention.

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a contact plug of a semiconductor device in accordance with some embodiments of the present invention.

Referring to FIG. 1, conductive structures 16 having line shapes are formed on a semiconductor substrate 10 where active regions are defined. The conductive structures 16 are formed on the semiconductor substrate 10 and extend along a first direction that is parallel to the substrate 10. Each of the conductive structures includes a conductive layer pattern 12 and a capping layer pattern 14 successively formed on the semiconductor substrate 10. The conductive layer pattern 12 may include a barrier layer pattern and a metal layer pattern. The barrier layer pattern may include a metal film pattern such as a titanium (Ti) film pattern and a metal nitride film pattern such as a titanium nitride (TiN) film pattern. Alternatively, the barrier layer pattern may include a metal film pattern and a metal nitride film pattern formed on the metal film pattern. The capping layer pattern 14 may include a nitride such as silicon nitride.

An insulation layer pattern 20a partially burying the conductive structures 16 is formed on the semiconductor substrate 10. When the insulation layer pattern 20a is formed on the semiconductor substrate 10, upper sidewalls and top of the capping layer patterns 14 are exposed. The insulation layer pattern 20a may include a material having a dielectric constant substantially lower than that of the capping layer pattern 14. For example, the insulation layer pattern 20a can include an oxide such as silicon oxide. The insulation layer pattern 20a extends farther away from the substrate 10 than the conductive layer patter 12. For example, as shown, a top surface of the insulation layer pattern 20a can be substantially higher than a top surface of the conductive layer pattern 12.

Insulation spacers 22 are respectively formed on sidewalls of the conductive structures 16 exposed by the insulation layer pattern 20a. Particularly, the insulation spacers 22 are formed on upper sidewalls of the conductive structures 16, respectively. Each of the insulation spacers 22 may include a nitride such as silicon nitride. The insulation spacer 22 may be formed using a material substantially identical to that of the capping layer pattern 14. Alternatively, the insulation spacer 22 may be formed using a material substantially different from that of the capping layer pattern 14. Bottom faces of the insulation spacers 22 make contact with the upper face of the insulation layer pattern 20a. The insulation layer pattern 20a is between the insulation spacers 22 and the substrate 10, so the insulation spacers 22 may be supported by the insulation layer pattern 20a.

An etching stop layer 24 is formed on the insulation layer pattern 20a to cover the conductive structures 16 and the insulation spacers 22. The etching stop layer 24 is formed on the insulation layer pattern 20a, the conductive structures 16, and the insulation spacers 22. The etching stop layer 24 may have a thickness of about 50 Å to about 500 Å.

An insulating interlayer 26 is formed on the etching stop layer 24 to completely cover the conductive structures 16. In particular, the conductive structures 16 are buried in the insulation layer pattern 20a and the insulating interlayer 26. The insulating interlayer 26 may include an oxide such as silicon oxide.

Contact plugs 40 are formed between the conductive structures 16 through the insulating interlayer 26 and the insulation layer pattern 20a. The contact plugs 40 may be directly on the active regions in the substrate 10. Upper portions of the contact plugs 40 are substantially larger than lower portions thereof. Accordingly, the contact plugs 40 have enlarged upper portions. In some embodiments, an upper face of the contact plugs is elongated in the first direction. More particularly, the upper face of the contact plugs 40 has a first width along the first direction and a second width along a second direction parallel to the substrate 10 and substantially perpendicular to the first direction. The first width is substantially larger than the second width. For example, each upper portion of the contact plugs 40 can have an elliptical shape or a track shape. The lower portions of the contact plugs 40 are relatively narrower than the upper portions thereof. Because the upper portions of the contact plugs 40 are relatively wider than that of the lower portions thereof, patterns that are to be formed on the upper portions of the contact plugs 40 may have increased alignment margins, and also separation between the patterns may increase.

FIGS. 2 to 17 are cross-sectional views illustrating methods of manufacturing the semiconductor device including the contact plug in accordance with some embodiment of the present invention. FIGS. 2, 4, 6, 8, 10, 12, 14, and 16 are cross-sectional views taken along a line of I-I' in FIG. 1. FIGS. 3, 5, 7, 9, 11, 13, 15 and 17 are cross-sectional views taken along a line of II-II' in FIG. 1. Particularly, the line of I-I' corresponds to the second direction, and the line of II-II' corresponds to the first direction.

Figure 2:
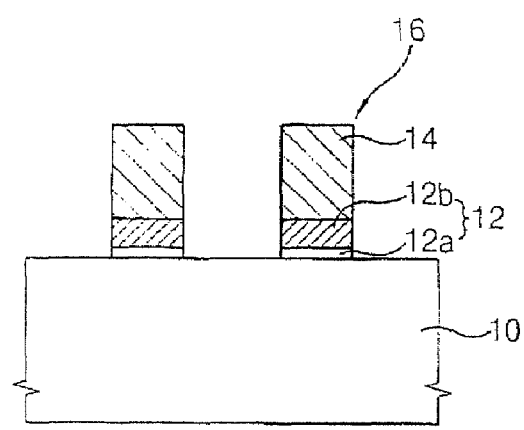
FIGS. 2 to 17 are cross sectional views illustrating methods of forming the semiconductor device including the contact plug in FIG. 1, in accordance with some embodiments of the present invention.
Figure 3:
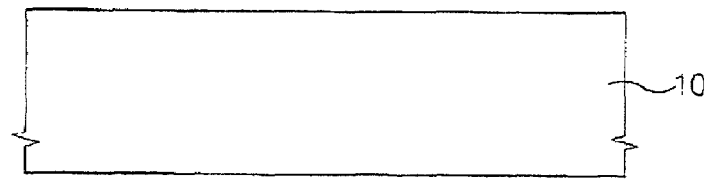

Referring to FIGS. 2 and 3, active patterns (not shown) are formed in the semiconductor substrate 10 by an isolation process, such as a shallow trench isolation (STI) process and/or a local oxidation of silicon (LOCOS) process. The semiconductor substrate 10 can include a silicon wafer.

A conductive layer (not shown) and a capping layer (not shown) are successively formed on the substrate 10 including the active patterns. The conductive layer includes a barrier film and a conductive film. The barrier film may include titanium (Ti) or titanium nitride (TiN). Alternatively, the barrier film may include titanium and titanium nitride. The conductive film may include a conductive material such as doped polysilicon, metal like tungsten (W) and/or aluminum (Al). The capping layer may include a nitride such as silicon nitride. The capping layer may extend twice as far away from the substrate 10 as the conductive layer.

The conductive layer and the capping layer are etched to form a conductive structure 16 including a conductive layer pattern 12 and a capping layer pattern 14. For example, the conductive structure 16 can have a line shape. The conductive structure 16 may correspond to a circuit wiring or a gate structure of a transistor. Alternatively, the conductive structure 16 may correspond to a bit line. An additional insulating interlayer may be formed between the substrate 10 and the conductive structure 16.

Figure 4:
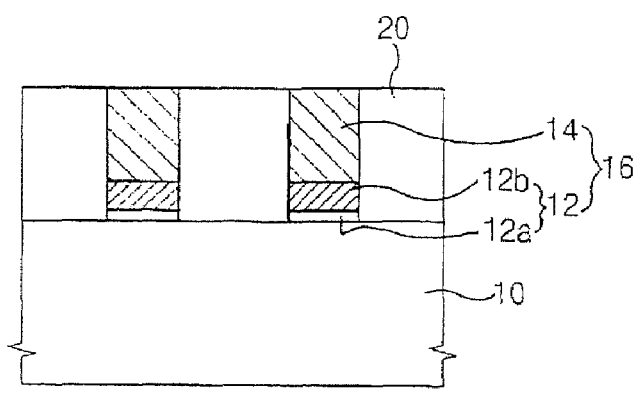
Figure 5:
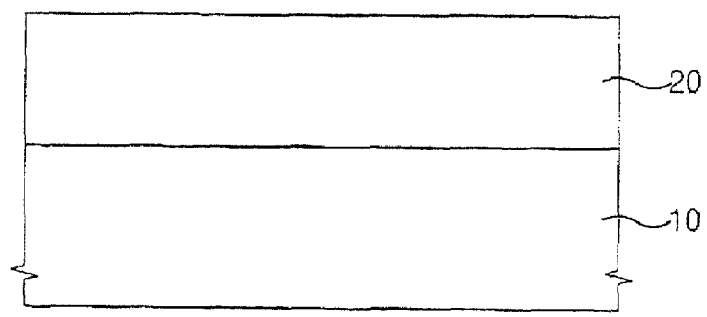

Referring to FIGS. 4 and 5, an insulation layer is formed on the substrate 10 to cover the conductive structure 16. The insulation layer may include a material having a dielectric constant relatively lower than that of the capping layer. For example, the insulation layer can include an oxide such as silicon oxide.

The insulation layer is planarized using a planarizing process such as a chemical mechanical polishing (CMP) process, an etch back process or a combination process of CMP and etch back, thereby forming a planarized insulation layer 20 that exposes an upper face of the conductive structure 16. Because the planarizing process for the insulation layer is carried out using the capping layer pattern 14 as a polishing stop layer, the insulation layer may be precisely polished to easily control a thickness of a remaining insulation layer that corresponds to the planarized insulation layer 20.

Figure 6:
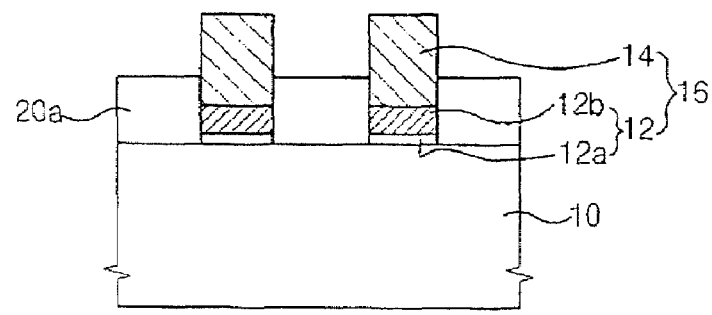
Figure 7:
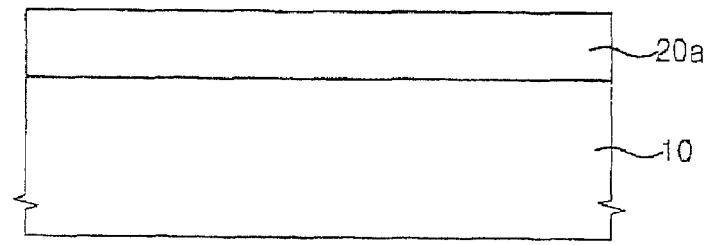

Referring to FIGS. 6 and 7, the planarized insulation layer 20 is partially etched to form an insulation layer pattern 20a that exposes upper sidewall portions of the conductive structures 16. In other words, sidewalls of the capping layer patterns 14 are partially exposed when the insulation layer pattern 20a is formed. Accordingly, upper portions of sidewalls of the conductive structures 16 are exposed according to formations of the insulation layer pattern 20a. An upper surface of the insulation layer pattern 20a is substantially higher than an upper surface of the conductive layer patterns 12. Thus, sidewalls of the conductive layer patterns 12 are not exposed after the insulation layer pattern 12a is formed.

Figure 8:
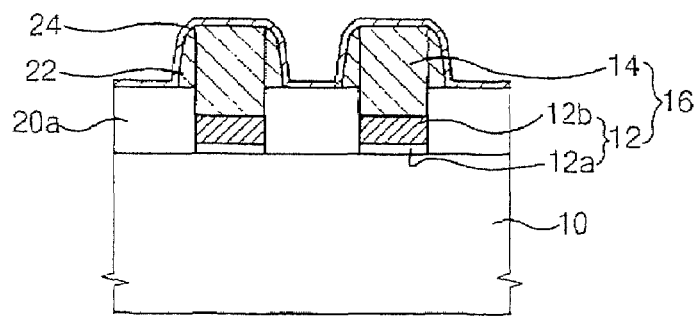
Figure 9:
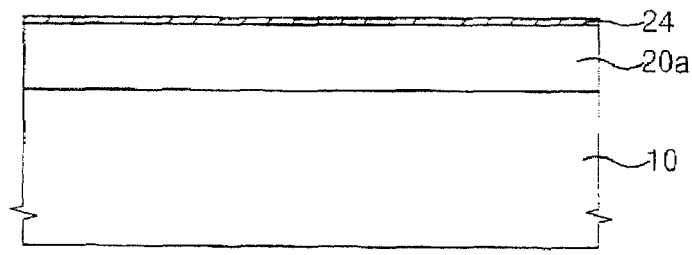

Referring to FIGS. 8 and 9, an insulation layer for spacer 22 is formed on the insulation layer pattern 20a to cover the exposed portions of the conductive structures 16. The insulation layer for the spacers 22 may include a nitride such as silicon nitride. The insulation layer for the spacers 22 is anisotropically etched to form the spacers 22 on the upper portions of the sidewalls of the conductive structures 16. Namely, bottom faces of the spacers 22 make contact with an upper face of the insulation layer pattern 20a. Thus, the insulation layer pattern 20a is between the spacers 22 and the substrate 10.

An etching stop layer 24 is formed on the insulation layer pattern 20a, the spacers 22, and the conductive structures 16. The etching stop layer 24 may include a nitride such as silicon nitride. The etching stop layer may have a thickness of about 50 Å to about 500 Å. When the etching stop layer 24 is formed, a successive etching process may be easily performed. However, the etching stop layer 24 may be not formed so as to simplify manufacturing processes for the semiconductor device including the contact plugs.

Figure 10:
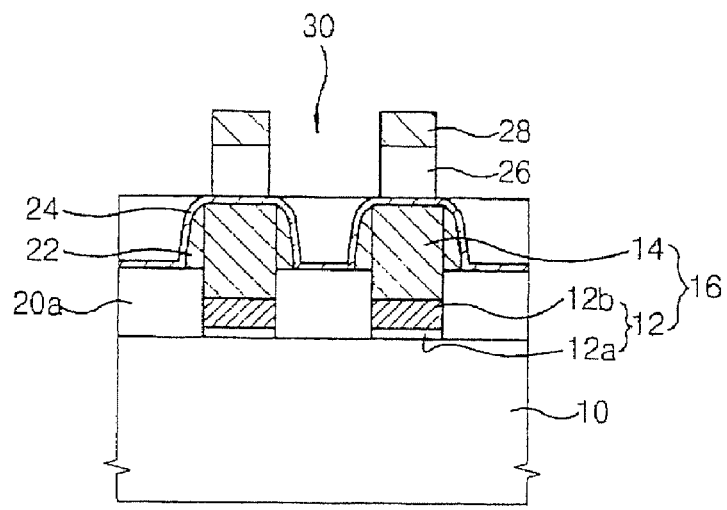
Figure 11:
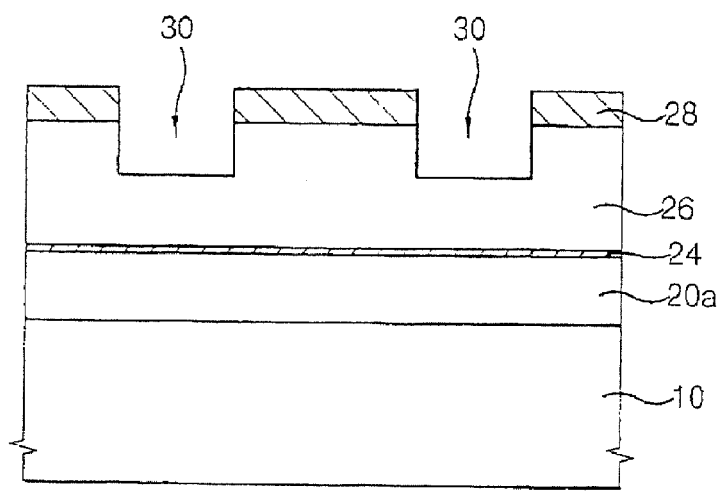

Referring to FIGS. 10 and 11, an insulating interlayer 26 is formed on the etching stop layer 24 to fully cover the conductive structures 16 and spacers 22. The insulating interlayer 26 may include an oxide such as silicon oxide. The insulating interlayer 26 is then planarized by a CMP process, an etch back process or a combination process of CMP and etch back.

A photoresist pattern 28 is formed on the insulating interlayer 26. Portions of the insulating interlayer 26 are primarily etched by an anisotropic etching process using the photoresist pattern 28 as an etching mask to form first openings 30.

Figure 12:
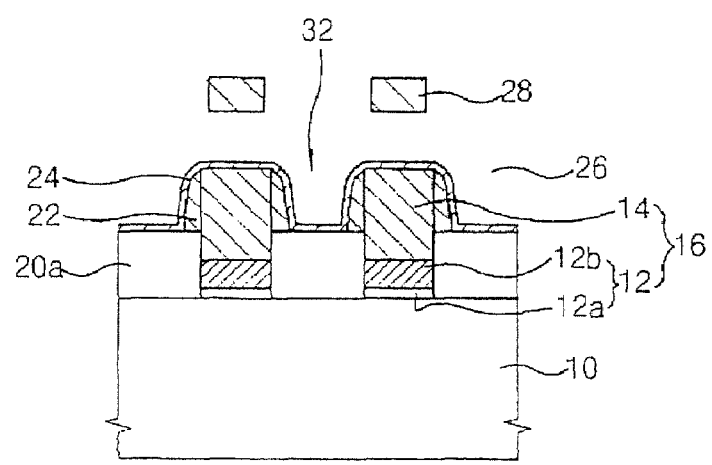
Figure 13:
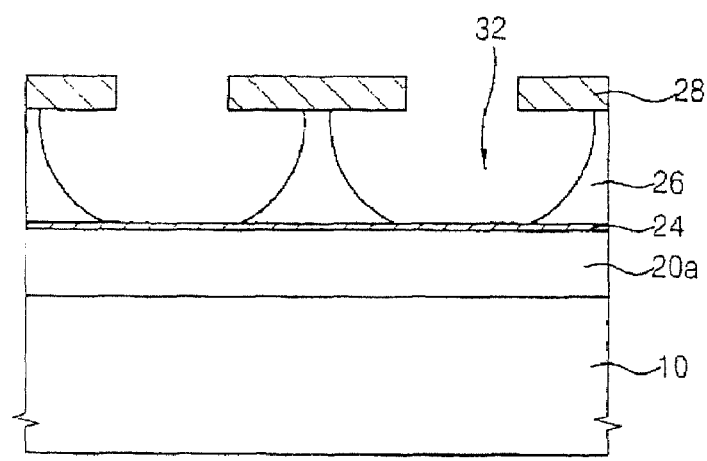

Referring to FIGS. 12 and 13, the portions of the insulating interlayer 26 are secondarily etched by an isotropic etching process using the photoresist pattern as an etching mask to form second openings 32 through the insulating interlayer 26. The second openings 32 are formed by extending the first openings 30 through the isotropic etching process. The second openings 32 may be formed by a wet etching process. That is, depths and widths of the first openings 30 are extended to form the second openings 32 that expose the etching stop layer 24. When the etching stop layer 24 is not formed, the second openings 32 expose the insulation layer pattern 20a. The second openings 32 are separated from each other by a predetermined interval.

The insulating interlayer 26 may be etched using an HF solution as an etching solution. Here, the HF solution may be diluted 1:100 with water. The wet etching process generally has a higher etching selectivity between silicon oxide layer and a silicon nitride layer than that of a dry etching process. Thus, when the wet etching process is employed for forming openings, losses of the capping layer pattern 14 and the spacers 22 may be minimized. In addition, upper portions of the second openings 32 may be effectively extended along the first direction by performing the wet etching process. However, as the spacers 22 are formed on the sidewalls of the upper portion of the conductive structure 16, the upper portion of the second openings 32 may not be extended along the second direction.

Figure 14:
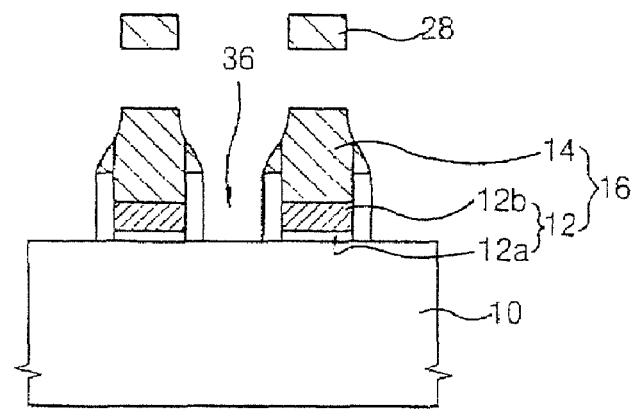
Figure 15:
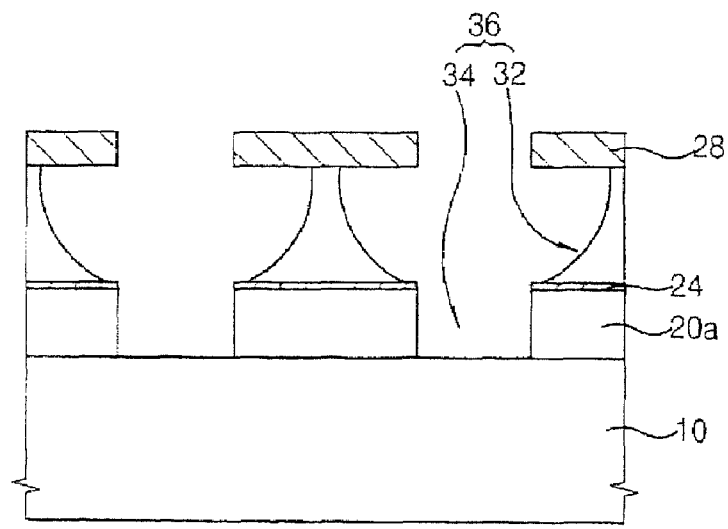

Referring to FIGS. 14 and 15, the etching stop layer 24 is exposed through the second openings 32, and the insulation layer pattern 20a are anisotropically etched using the photoresist pattern 28 as an etching mask to form third openings 34 that expose the active patterns. When an anisotropic etching process is performed, layers exposed through the photoresist pattern 28 are anisotropically etched, and the capping layer pattern 14 and the spacers 22 may be self-aligned. Thus, an upper portion of the third opening 34 has a smaller size than that of the second opening 32. The capping layer pattern 14 and the insulation layer pattern 22 may be partially etched through the anisotropic etching process for forming the third opening 34. The second opening 32 and the third opening 34 correspond to a contact hole 36.

Figure 16:
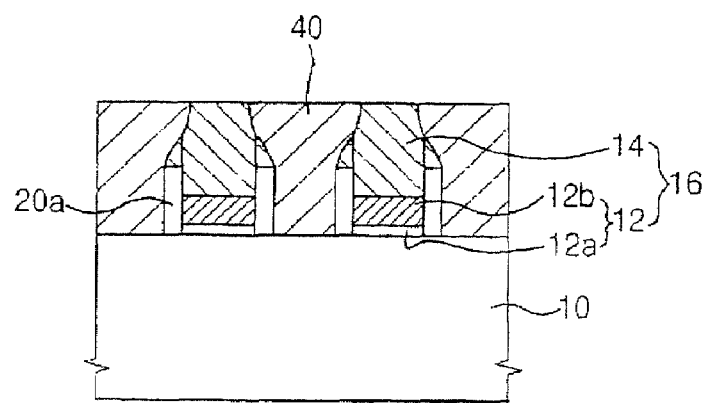
Figure 17:
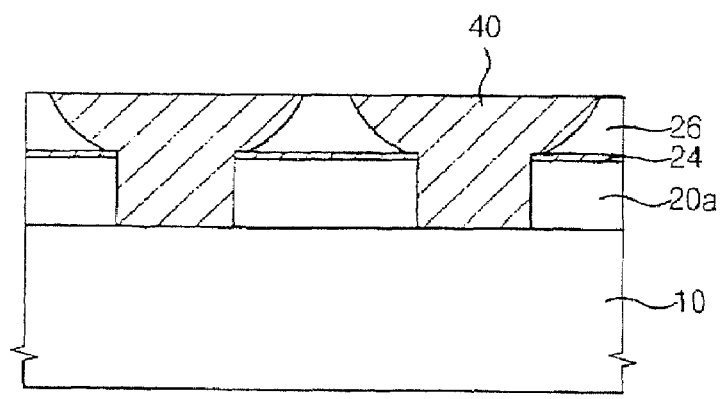

Referring to FIGS. 16 and 17, the photoresist pattern 28 may be removed by a conventional ashing and/or stripping process. The contact hole is filled with conductive material to form a contact plug 40. The contact plug 40 may be insulated by the capping layer pattern 14 along the second direction, and by the insulating interlayer 26 along the first direction.

The upper portion of the contact plug 40 may be larger than a lower portion thereof along the first direction. Thus, the contact plug 40 may have a 'Y' shape along the first direction.

Figure 18:
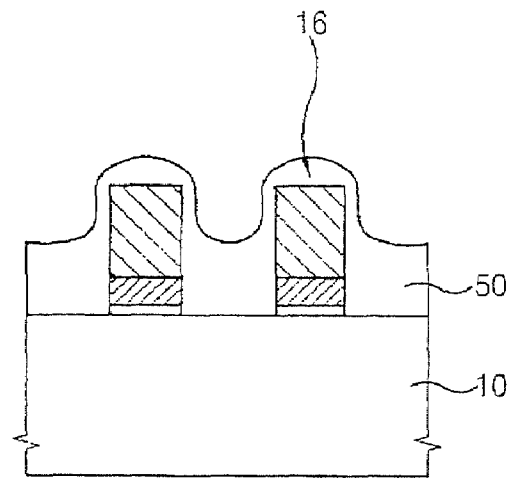
FIGS. 18 and 19 are cross sectional views illustrating a semiconductor device including a contact plug in accordance with some embodiments of the present invention.
Figure 19:
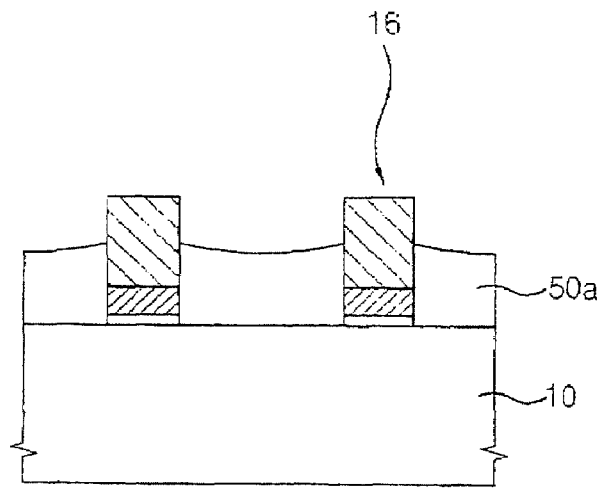

FIGS. 18 and 19 are cross sectional views illustrating a semiconductor device including a contact plug in accordance with some embodiments of the present invention. Here, FIGS. 18 and 19 are cross sectional views taken along the line of I-I' in FIG. 1 corresponding to the second direction.

Referring to FIG. 18, structures in FIG. 2 are formed on a substrate 10. Detailed description for forming the structures 16 in FIG. 2 will be omitted. Then, an insulation layer 50 is formed on the substrate 10 to partially cover the conductive structure 16. The insulation layer 50 may include a material having a dielectric constant relatively lower than a nitride such as silicon nitride. For example, the insulation layer 50 includes an oxide such as silicon oxide. A lowest portion of the insulation layer 50 may be substantially higher than an upper surface of a conductive layer pattern of the conductive structure 16.

Referring to FIG. 19, the insulation layer 50 is etched by an isotropic etching process to form an insulation layer pattern 50a that exposes upper portions of the conductive structures 16. Here, the insulation layer 50 on the upper portion of the sidewalls and on upper faces of the conductive structures 16 is removed through the isotropic etching process. That is, upper portions of sidewalls of the conductive structures 16 are exposed according to formations of the insulation layer pattern 50a. An upper face of the insulation layer pattern 50a is substantially equal to or higher than that of the conductive layer pattern of the conductive structure 16. When the insulation layer pattern 50a is formed using the above-described method of the present embodiment, the process for forming a contact plug may be simplified. Then, the contact plug is completed using a substantially identical method illustrated in FIGS. 8 to 17.

Figure 20:
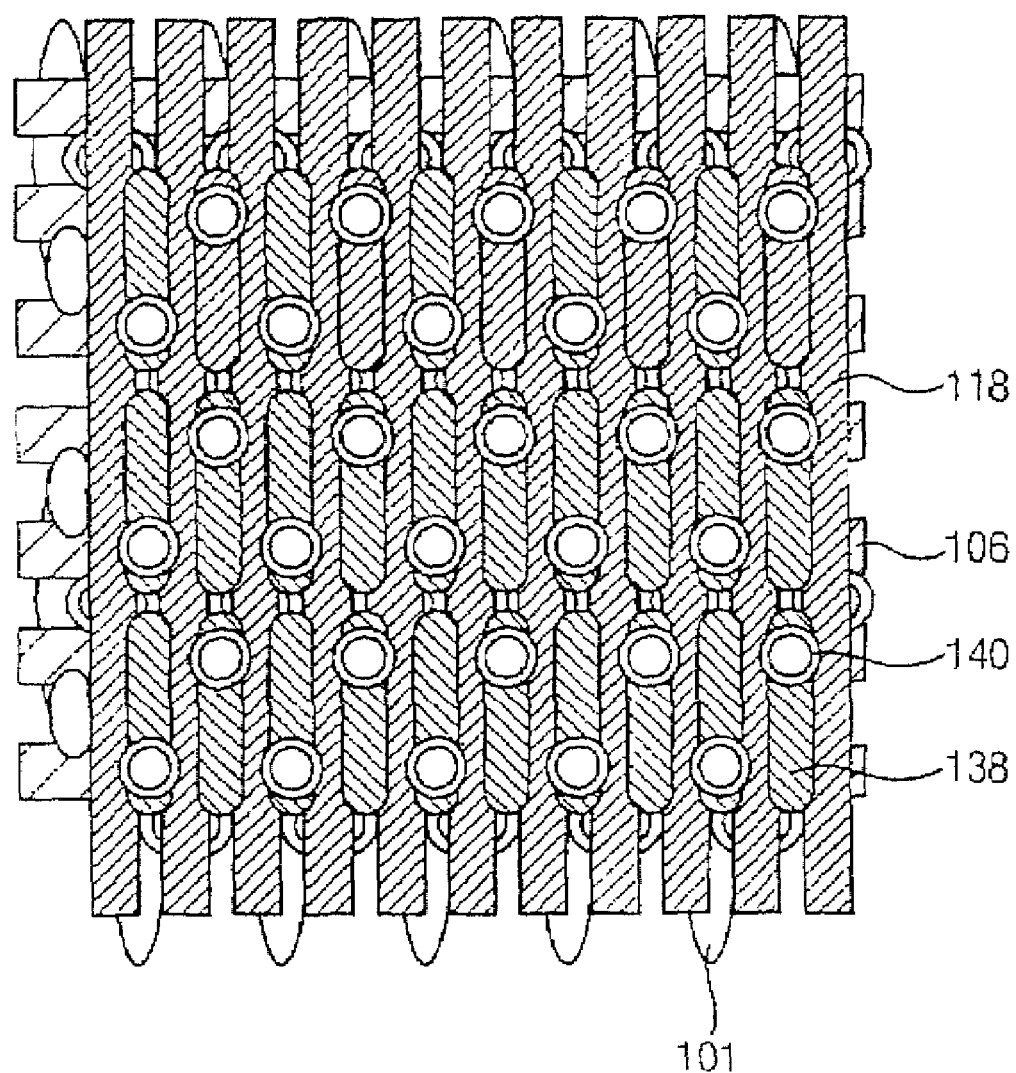
FIG. 20 is a plane view illustrating a DRAM device in accordance with some embodiment of the present invention.
Figure 21:
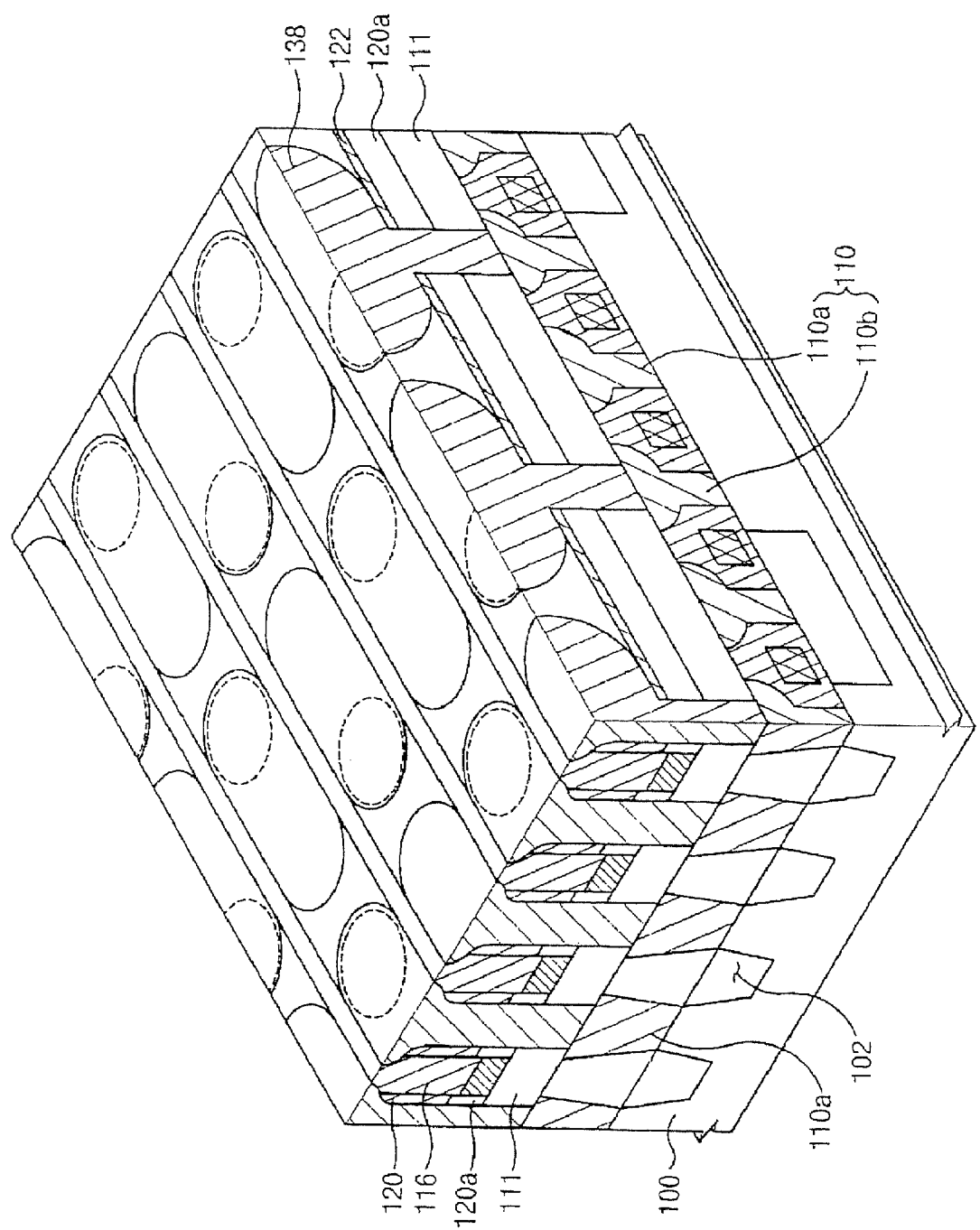
FIG. 21 is a perspective view illustrating the DRAM device in FIG. 20.

FIG. 20 is a plane view illustrating a DRAM device in accordance with some embodiment of the present invention. FIG. 21 is a perspective view illustrating the DRAM device in FIG. 20.

Referring to FIGS. 20 and 21, word line structures 106 are disposed along a second direction on a substrate 100 where active patterns 101 are defined along a first direction, and where the second direction is substantially perpendicular to the first direction. Two word line structures 106 may be disposed on one active pattern 101 and provided to two unit cells. Particularly, the word line structure 106 may include a gate insulation layer pattern, a gate electrode pattern and a hard mask pattern. Impurity regions are disposed at the surface portions near the sidewalls of the word line structures 106. A first impurity region at a central portion of the active pattern 101 corresponds to a bit line contact region, and a second impurity region at a side portion of the active pattern 101 corresponds to a capacitor contact region.

A first insulating interlayer is provided on the substrate 100 to cover the word line structures 106. Contact pads 110 respectively contacting the first and second impurity regions are provided in the first insulating interlayer.

A second insulating interlayer is disposed on the first insulating interlayer including the contact pads 110. A bit line contact making contact with the contact pad 110 is provided through the second insulating interlayer. Here, the contact pad 110 contacts the first impurity region. The bit line contact may include a barrier metal layer pattern and a conductive layer pattern. The conductive layer pattern may include a conductive material such as tungsten (W).

Bit line structures 118 are disposed on the second insulating interlayer along the first direction. The bit line structures 118 may include a conductive layer pattern and a capping layer pattern, both of which have line shapes. Here, the conductive layer pattern may include a metal film pattern, a polysilicon film pattern and a silicide film pattern. Alternatively, the conductive layer pattern may include a multi-film pattern including the metal film pattern, the polysilicon film pattern, and/or the silicide film pattern. For example, the conductive layer pattern may include barrier metal film pattern and a tungsten film pattern. A lower face of the conductive layer pattern may make contact with the bit line contact. Thus, the conductive layer pattern is electrically connected to the first impurity region through the bit line contact.

An insulation layer pattern 120a is provided to partially cover a lower portion of the bit line structure 118. The insulation layer pattern 120a may reduce a parasitic capacitance generated by the conductive layer pattern. Thus, the insulation layer pattern may include a material having a relatively low dielectric constant. For example, the insulation layer pattern includes an oxide such as silicon oxide. An upper face of the insulation layer pattern is substantially equal to or higher than that of the conductive layer pattern.

Spacers 120 are provided on sidewalls of the upper portions of the bit line structures 118. That is, the sidewalls of the upper portions of the bit line structures 118 may be partially covered by the spacers 120. The spacers 120 are provided on the insulation layer pattern 120a. The spacers 120 may include a nitride such as silicon nitride.

An etching stop layer 122 is disposed on the insulation layer pattern 120a and the bit line structures 118. The etching stop layer 122 may have a thickness of about 50 Å to about 500 Å

A third insulating interlayer is disposed on the insulation layer pattern 120a to cover the bit line structure 118. Storage node contacts 138 are provided in the third insulating interlayer. Here, each of the storage node contacts 138 may be self-aligned by the bit line structure 118. A first width of an upper portion of the storage node contact 138 is wider than a second width of the upper portion thereof. Here, the first width is substantially parallel to the first direction, and the second width is substantially parallel to the second direction.

Also, the upper portion of the storage node contact 138 is extended from the lower portion of the storage node contact 138 along the first direction.

Capacitors 140 are disposed on predetermined portions of upper faces of the storage node contacts 138. In particular, the predetermined portions may be shifted to positions along the first direction from centers of the upper faces of the storage node contacts 138. Also, the capacitors 140 may be disposed in a slant direction relative to the first and second directions (i.e., relatively aligned along a non-zero angle relative to both the first and second directions).

As the upper portion of the storage node contact 138 is enlarged along the first direction, an area for forming the capacitor 140 on the storage node contact 138 may be extended. Thus, the capacitor 140 of the DRAM device in accordance with the present embodiment may have an improved capacitance.

In addition, since the insulation layer pattern 120a including material that has a low dielectric constant is provided between the conductive layer patterns of the bit line structures 118 and the storage node contacts 138, the parasitic capacitance may be outstandingly minimized. As a result, the operation characteristics of the DRAM device may be enhanced.

FIGS. 22 to 27 are plane views illustrating methods of forming the DRAM device in FIGS. 20 and 21, and FIGS. 28 to 43 are cross sectional views illustrating methods of forming the DRAM device in FIGS. 20 and 21. FIGS. 29, 31, 33, 35, 37, 39, 41 and 43 are cross sectional views taken a line parallel to a first direction, and FIGS. 28, 30, 32, 34, 36, 38, 40, and 42 are cross sectional views taken a line parallel to a second direction. Here, the first direction is parallel to bit lines, and the second direction is substantially perpendicular to the first direction.

Figure 22:
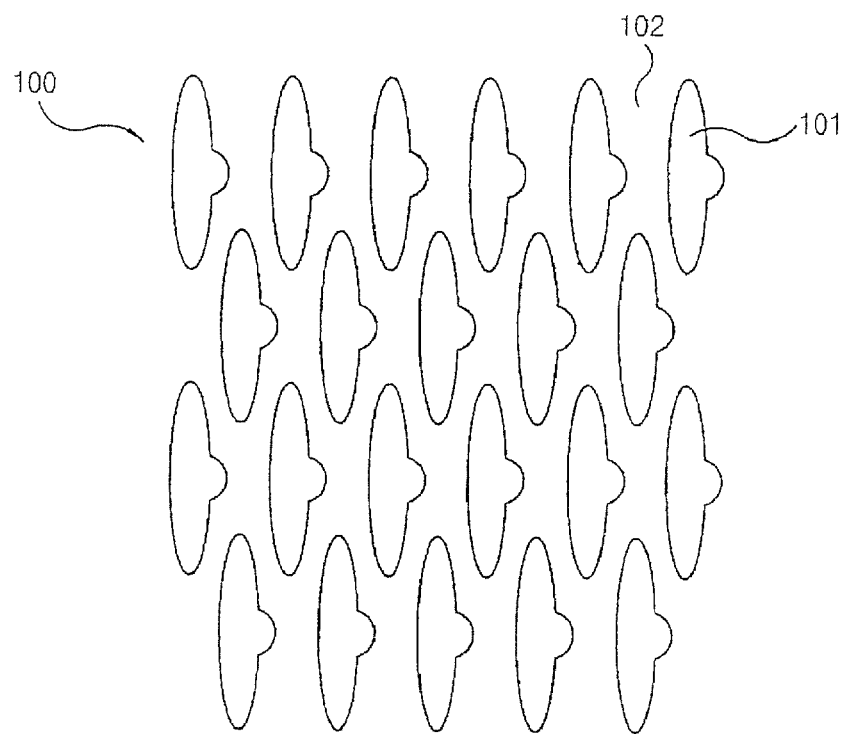
FIGS. 22 to 27 are plane views illustrating methods of manufacturing the DRAM device in FIGS. 20 and 21, in accordance with some embodiments of the present invention.

Referring to FIG. 22, active patterns 101 are formed on a semiconductor substrate 100 by an isolation process such as a shallow trench isolation (STI) process and a local oxidation of silicon (LOCOS) process.

In particular, a buffer oxide layer (not shown) is formed on the substrate 100. The buffer oxide layer may relieve stresses between the substrate 100 and a nitride layer (not shown) subsequently formed on the buffer oxide layer. Then, the nitride layer is formed on the buffer oxide layer. The nitride layer may include silicon nitride. The nitride layer may be etched by a conventional photolithography process to form a nitride layer pattern (not shown). Here, the nitride layer may be etched by a dry etching process. Then, the buffer oxide layer is etched using the nitride layer pattern as an etching mask to form a buffer oxide layer pattern. An exposed portion of the substrate through the nitride layer pattern may be etched using the nitride layer pattern as an etching mask to form a trench having a predetermined depth. An anti-reflective layer (ARL) may be additionally formed on the nitride layer to ensure a process margin. A silicon oxide layer is formed on the substrate to fill the trench, and then planarized to expose the nitride layer pattern. The nitride layer pattern and the buffer oxide layer pattern are removed by a wet etching process to form a field region 102 and the active pattern 101.

Figure 23:
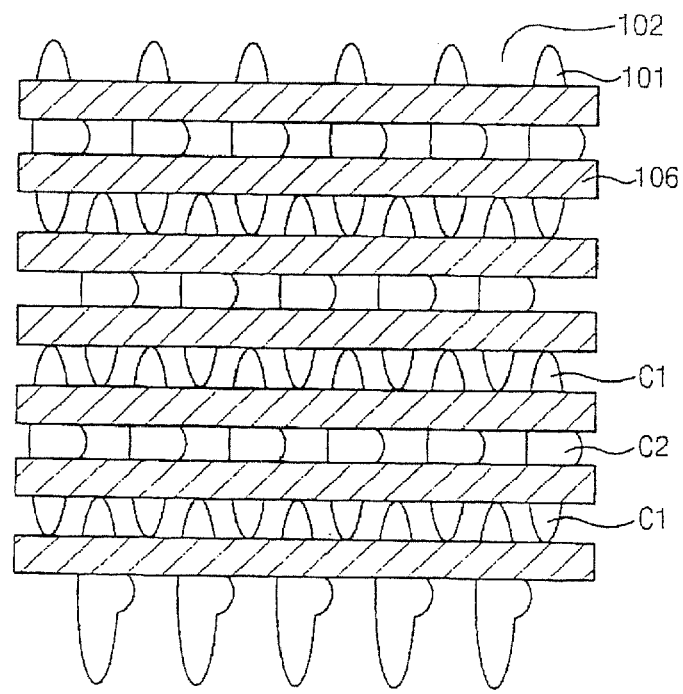

Referring to FIG. 23, after forming a gate oxide layer on the active pattern 101 by a thermal oxidation process, a gate electrode layer and a hard mask layer are successively formed on the gate oxide layer. The gate electrode layer may include conductive material. Then, the hard mask layer and the gate electrode layer are patterned to form a word line structure 106. The word line structure 106 may include a gate electrode pattern and a hard mask pattern. The word line structure 106 has a line shape along the second direction that is substantially perpendicular to the first direction. Here, two word line structures 106 that are substantially parallel to each other are formed on one active pattern 101. Thus, two unit cells may be formed on the active pattern 101. Spacers (not shown) for the word line structures 106 are formed on sidewalls of the word line structures 106. The spacers may include a nitride such as silicon nitride. Then, impurities are implanted into surface portions of the substrate 100 exposed through the word line structures 106 by an ion-implantation process to form source/drain regions at the surface portions of the substrate 100 near the word line structures 106. The source/drain region formed near an edge of the active pattern 101 corresponds to a capacitor node contact region C1 contacting a storage electrode of a capacitor. The source/drain region formed at a center of the active pattern 101 corresponds to a bit line contact region C2 contacting a bit line.

Figure 24:
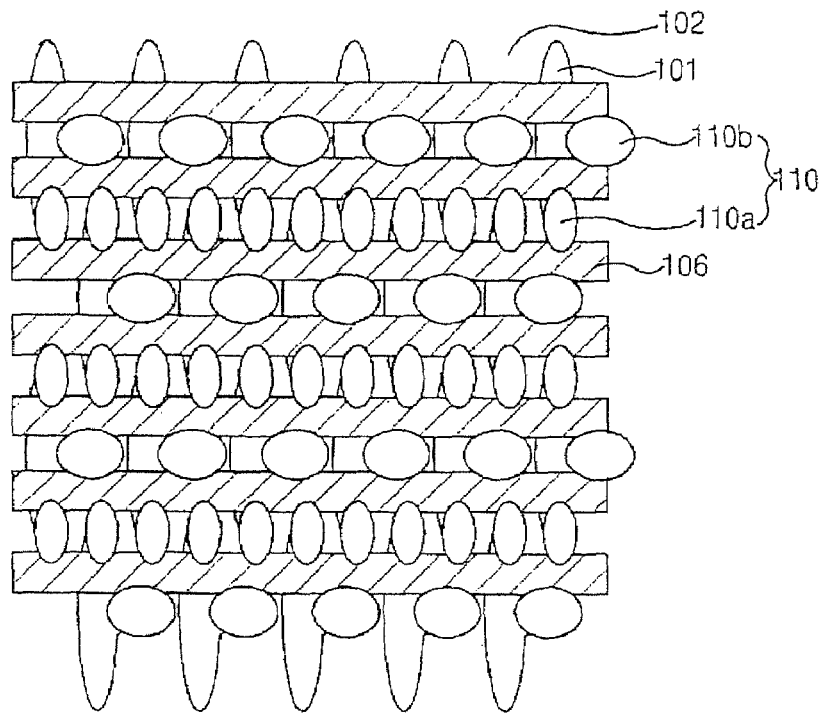

Referring to FIG. 24, a first insulating interlayer is formed to cover the word line structure. The first insulating interlayer is partially etched by a conventional photolithographic process to form a self-aligned contact hole exposing the source/drain region. Then, a doped-polysilicon layer is formed to fill the contact hole and then planarized to form a contact pad 110 making contact with the source/drain region. The contact pad contacting the capacitor node contact region C1 corresponds to a first contact pad 110a, and the contact pad contacting the bit line contact region corresponds to a second contact pad 110b.

Figure 25:
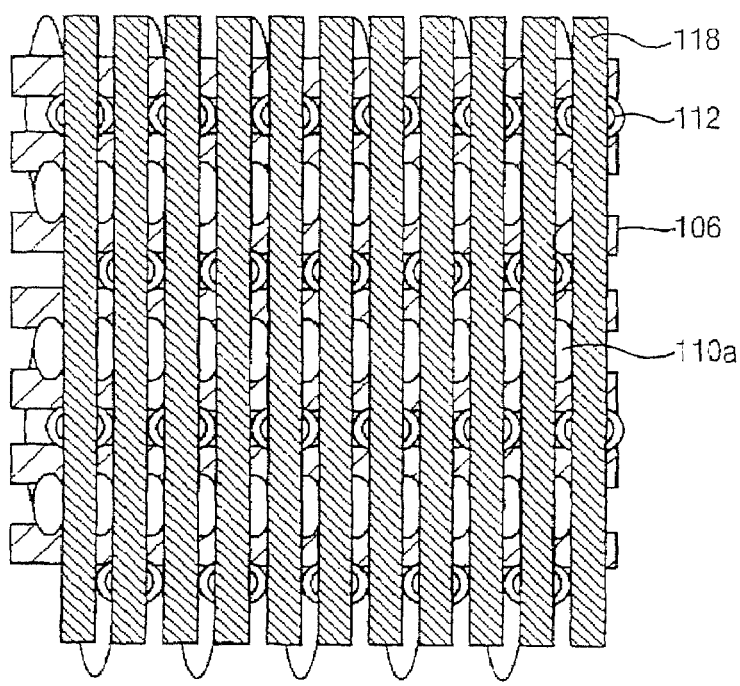

Referring to FIG. 25, a second insulating interlayer is formed on the first insulating interlayer including the first and second contact pads 110a and 110b. A predetermined portion of the second insulating interlayer is etched to form a bit line contact hole selectively exposing the second contact pad 110b. Then, a barrier metal layer is formed on the inner walls and bottom face of the bit line contact hole, and on the second insulating interlayer. The barrier metal layer may include a titanium film, a titanium nitride film, a tantalum film, or a tantalum nitride film. Alternatively, the barrier metal layer may include a multi-film of the titanium film, the titanium nitride film, the tantalum film, and/or the tantalum nitride film. A tungsten layer is formed on the barrier metal layer. A silicon nitride layer as a capping layer is formed on the tungsten layer. When the tungsten layer is etched, the capping layer functions as a hard mask, and also the capping layer protects the tungsten layer through a process for forming a self-aligned contact. Thus, the capping layer should have a sufficient thickness to maintain a prescribed thickness before completing processes for patterning the tungsten layer and for forming the contact. For example, the capping layer may have twice the thickness of the tungsten layer. A first photoresist pattern is formed on the capping layer, and which can be used to form a bit line structure. The capping layer is etched using the first photoresist pattern as a mask to form a capping layer pattern. The first photoresist pattern is then removed by a conventional ashing and/or stripping process. The tungsten layer and the barrier layer are anisotropically etched using the capping layer pattern as an etching mask to simultaneously form a bit line contact 112 and a bit line structure 118 including a barrier layer pattern, a tungsten layer pattern and a capping layer pattern. The bit line structure 118 may have a line shape along the first direction. The bit line structure 118 is connected to the second contact pad 110b through the bit line contact 112. Thus, the bit line structure 118 is electrically connected to the bit line contact region C2.

Figure 28:
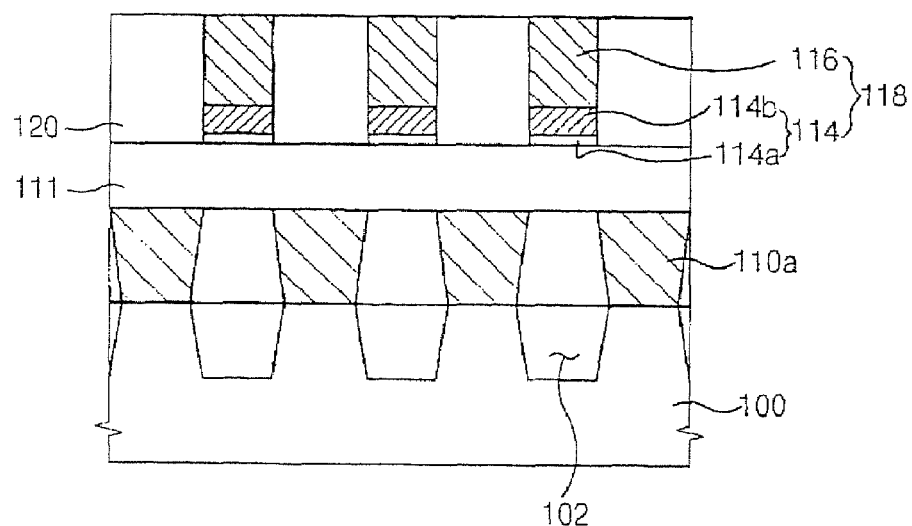
FIGS. 28 to 43 are cross sectional views illustrating methods of manufacturing the DRAM device in FIGS. 20 and 21, in accordance with some embodiments of the present invention.
Figure 29:
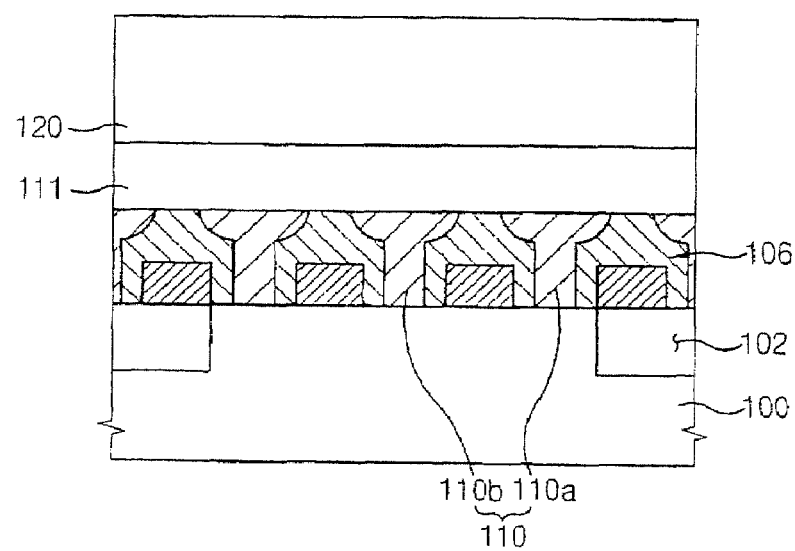

Referring to FIGS. 28 and 29, an insulation layer 120 is formed to fully cover the bit line structure 118. The insulation layer 120 may include a material having a dielectric constant lower than that of the capping layer pattern 116. The insulation layer 120 is planarized to expose the capping layer pattern 116. Here, the insulation layer 120 may be planarized by a chemical mechanical polishing (CMP) process. Since the planarizing process for the insulation layer 120 is carried out using the capping layer pattern 116 as a polishing stop layer, the insulation layer 120 may be precisely polished to easily control a thickness of a remaining insulation layer 120.

Figure 30:
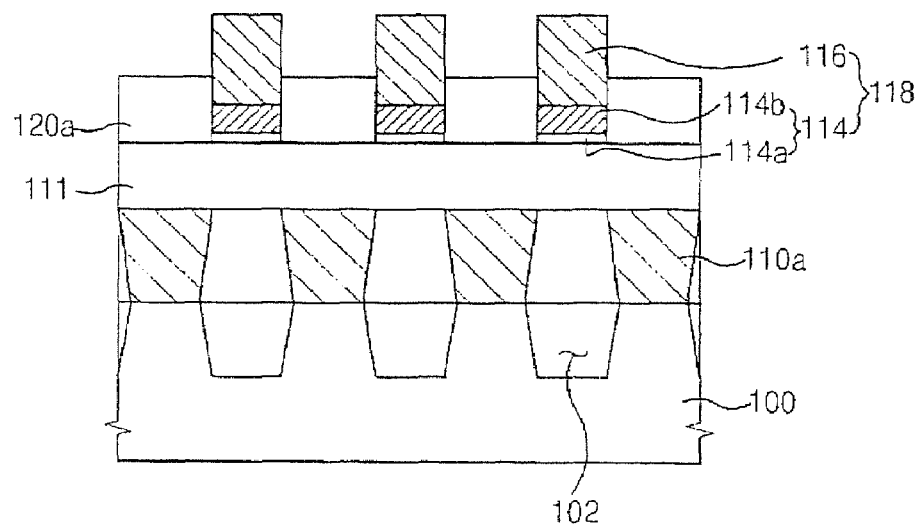
Figure 31:
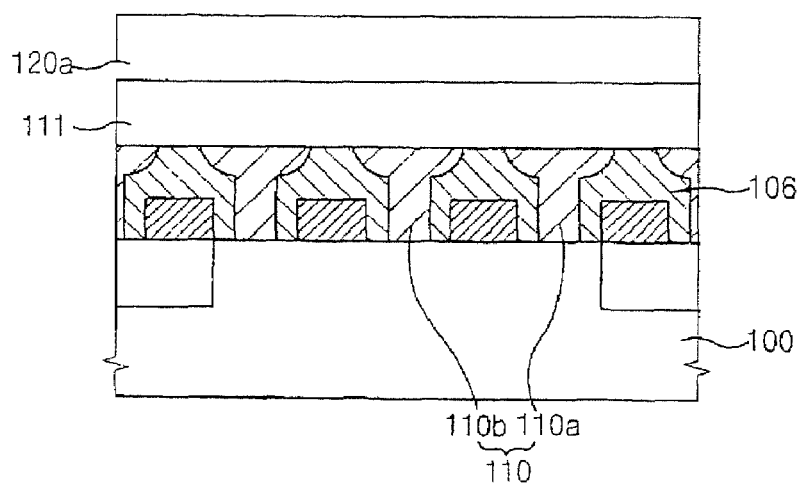

Referring to FIGS. 30 and 31, the planarized insulation layer 120 is anisotropically etched to form an insulation layer pattern 120a to partially cover a lower portion of the bit line structure 118. An upper surface of the insulation layer pattern 120a is substantially equal to or higher than an upper surface of the tungsten layer pattern 114b in the bit line structure 118.

Figure 32:
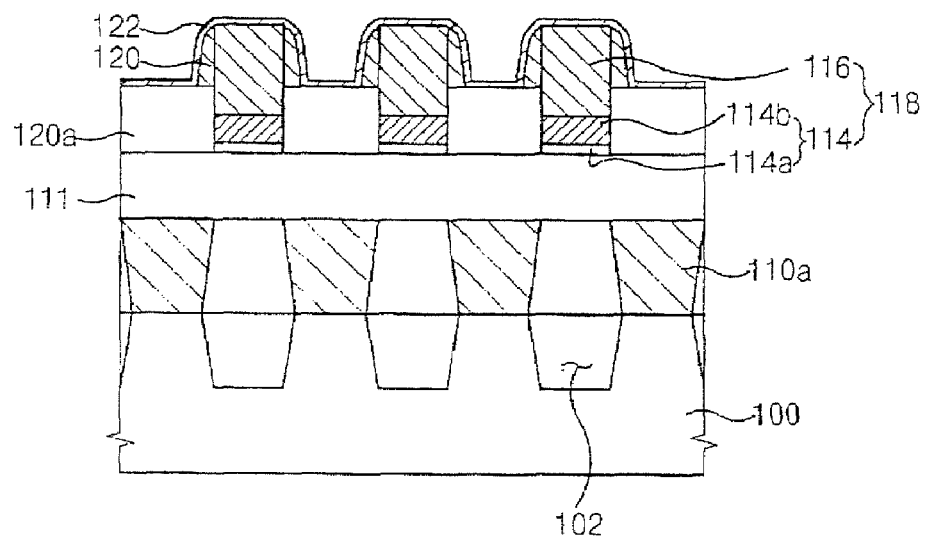
Figure 33:
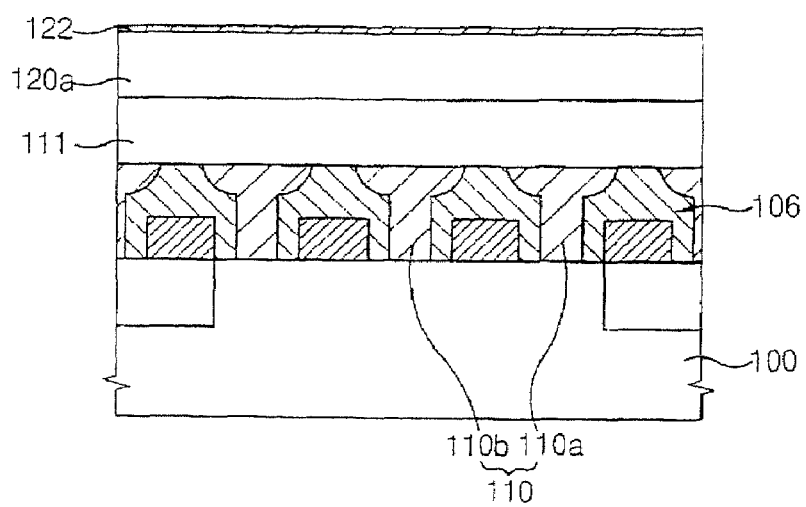

Referring to FIGS. 32 and 33, a silicon nitride layer is formed on the insulation layer pattern 120a and on the bit line structure 118. Then, the silicon nitride layer is anisotropically etched to expose the insulation layer pattern 120a. Thus, bit line spacers 120 are formed on upper sidewalls of the bit line structure 118. Namely, bottom faces of the spacers 120 contact an upper face of the insulation layer pattern 120a. Accordingly, the insulation layer pattern 120a is between the spacers 120 and the substrate, and may thereby support the spacers 120. An etching stop layer 122 is formed on the insulation layer pattern 120a, the spacers 120 and the bit line structures 118. The etching stop layer 24 may include a nitride such as silicon nitride. The etching stop layer 122 may not be formed to simplify manufacturing processes for the semiconductor device including contact plugs.

Figure 26:
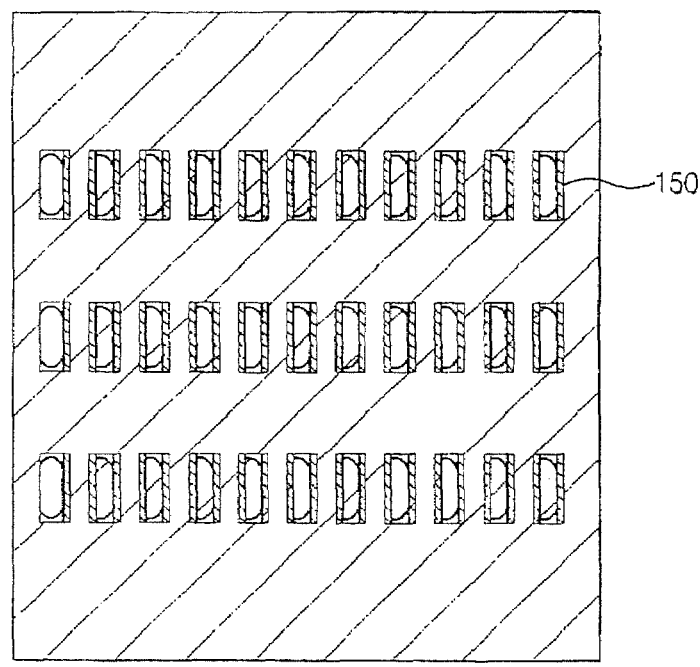
Figure 34:
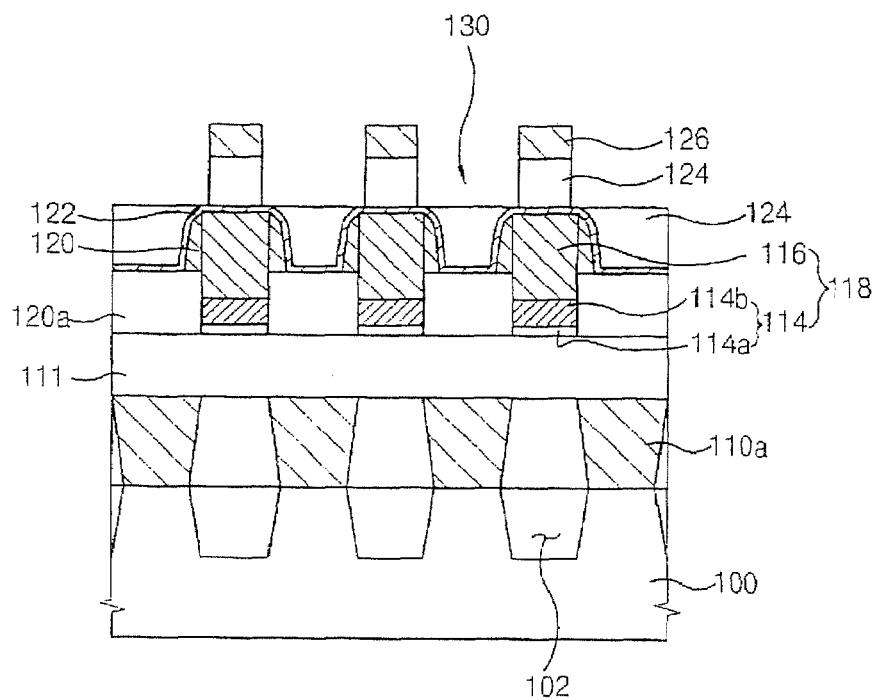
Figure 35:
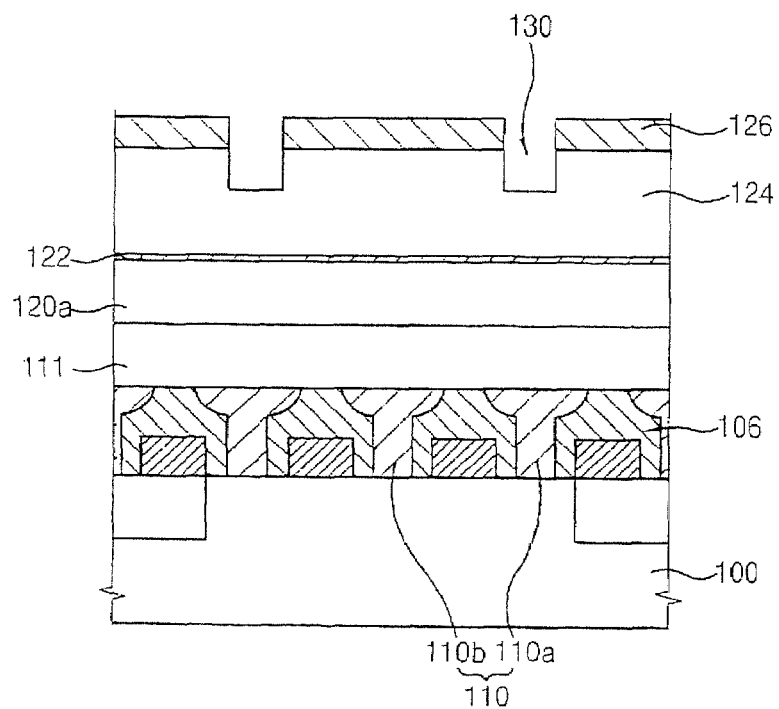

Referring to FIGS. 26, 34 and 35, a third insulating interlayer 124 is formed on the etching stop layer 122 to completely cover the bit line structure 118. The third insulating interlayer 124 is then planarized by a CMP process, an etch back process or a combination process of CMP and etch back. Then, a second photoresist pattern 126 for forming a storage node contact hole is formed on the third insulating interlayer 124. An opened portion 150 of the second photoresist pattern 126 may have a contact shape such as shown in FIG. 26. As the storage node contact hole is formed to be self-aligned to the bit line structure 118, the opened portion 150 of the second photoresist pattern 126 corresponds to the bit line structure 118.

Alternatively, the hard mask pattern may be used instead of the second photoresist pattern 126. Here, the hard mask pattern may include a silicon nitride layer pattern or a silicon oxide layer pattern.

Then, the third insulating interlayer 124 is partially etched using the second photoresist pattern 126 as an etching mask to form first openings 130.

Figure 36:
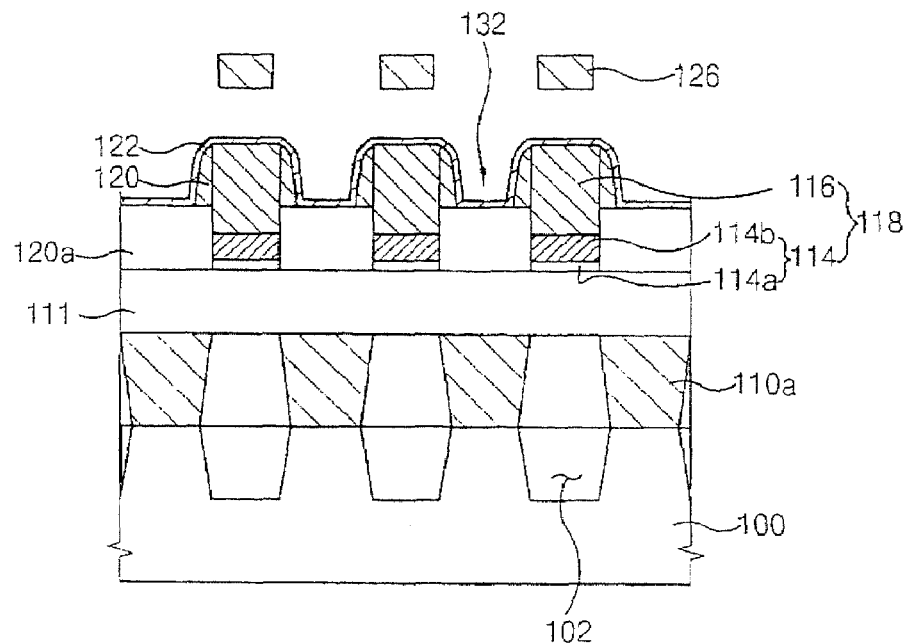
Figure 37:
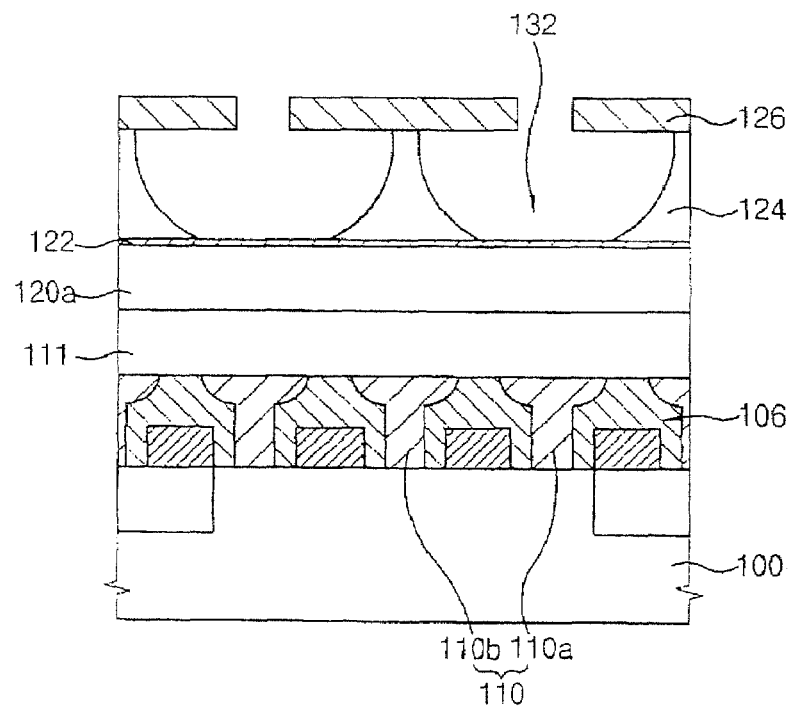

Referring to FIGS. 36 and 37, the third insulating interlayer 124 is partially etched using the second photoresist pattern 126 as an etching mask to form second openings 132 through the third insulating interlayer 124. Upper portions of the second openings 132 may be larger than those of the first openings 130. The etching process may be an isotropic etching process, and the second openings 132 may be formed by a wet etching process. That is, depths and widths of the first openings 130 are extended to form second openings 132 that expose the etching stop layer 122. When the etching stop layer 122 is not formed, the second openings 132 may expose the insulation layer pattern 120a. The second openings 132 are separated from each other by a predetermined interval. The upper portions of the second openings 132 may be effectively extended along the first direction by performing the wet etching process. However, as the spacers 120 are formed on the sidewalls of the upper portions of the bit line structures 118, the upper portions of the second openings 132 may not be extended along the second direction that is substantially perpendicular to the first direction. The third insulating interlayer 124 is also etched along a perpendicular direction relative to the surface of the substrate 100. Thus, a thickness of the third insulating interlayer 124 etched by a dry etching process may be reduced. However, the wet etching process generally has a higher etching selectivity between a silicon oxide layer and a silicon nitride layer than that of a dry etching process. Thus, losses of the capping layer pattern 116 and the spacers 120 may be minimized.

Figure 38:
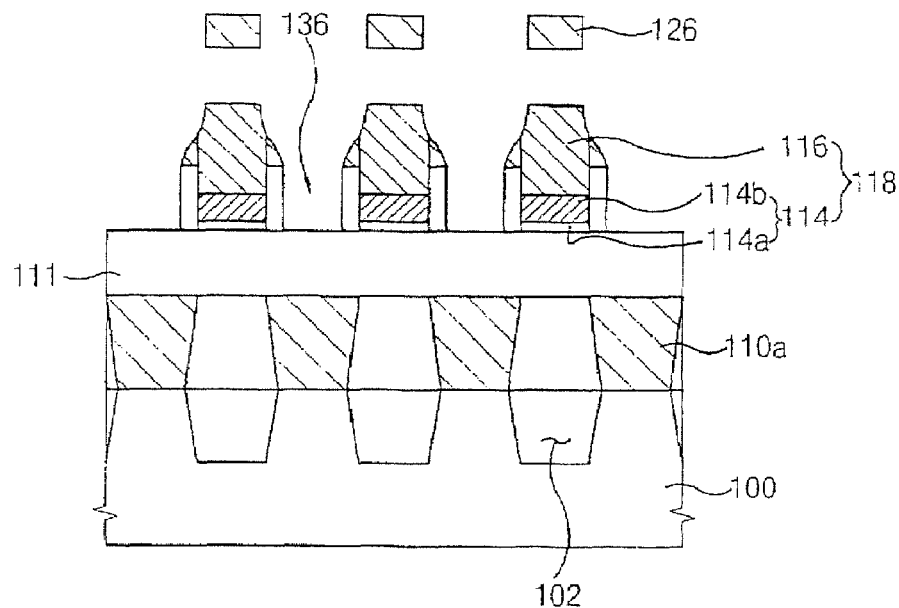
Figure 39:
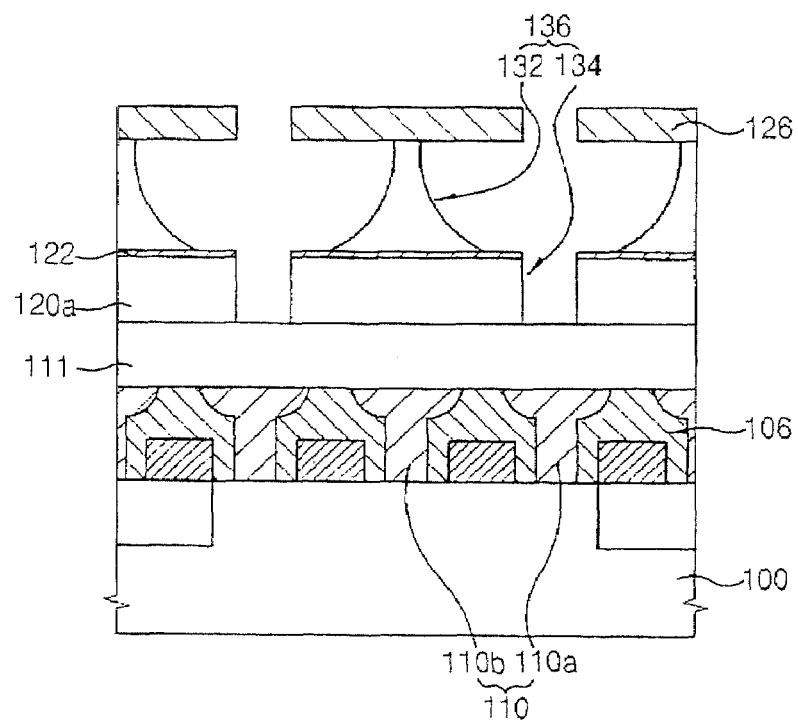

Referring to FIGS. 38 and 39, the etching stop layer 122, the insulation layer pattern 120a, and the second insulating interlayer 111 under the second openings 132 are successively etched using the second photoresist pattern 126 as an etching mask to form third openings 134 exposing upper faces of the first contact pads 110a. The third openings 134 correspond to the opened portions of the second photoresist pattern 126, and may be self-aligned by the bit line structures 118. Thus, upper portions of the third openings 134 may have smaller sizes than those of the second openings 132. The second openings 132 and the third openings 134 correspond to storage node contact holes 136.

Figure 27:
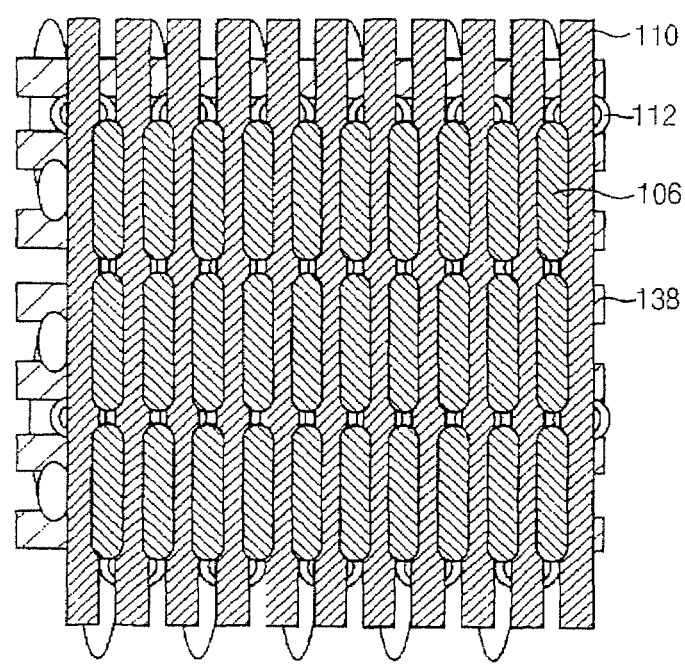
Figure 40:
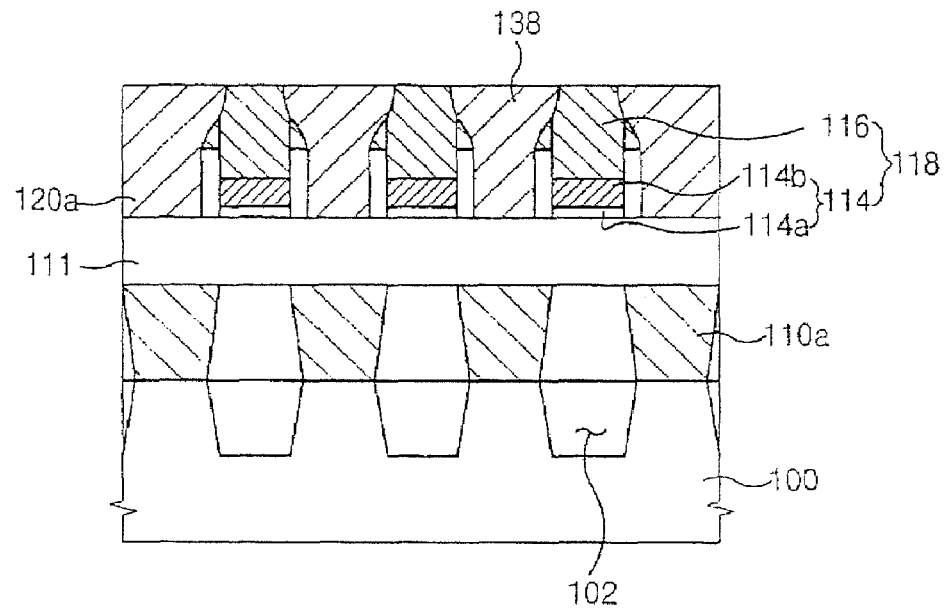
Figure 41:
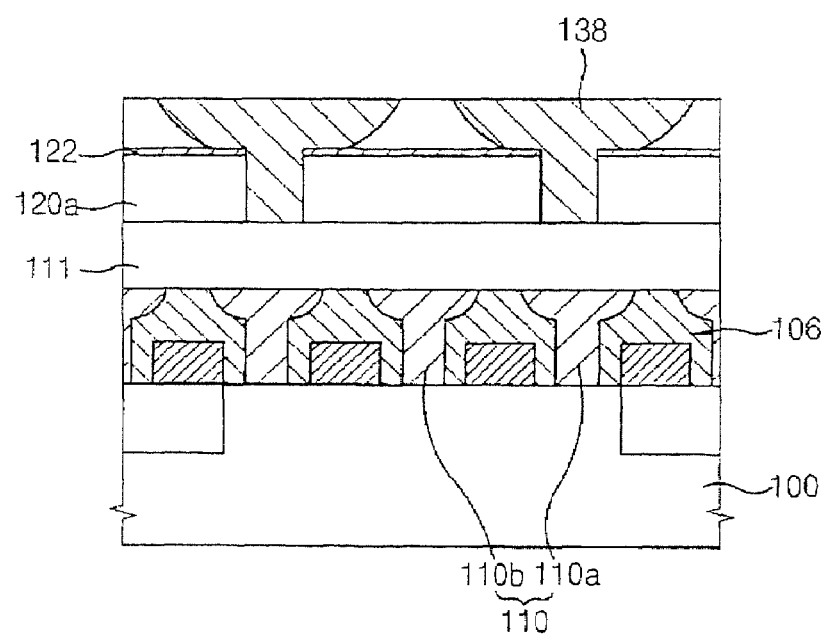

Referring to FIGS. 40 and 41, the second photoresist pattern 126 may be removed by a conventional ashing and/or stripping process. The storage node contact holes 136 are filled with conductive material to form storage node contacts 138. The sidewalls of upper portions of the storage node contacts 138 contact the bit line spacers 120. FIG. 27 is a plane view illustrating a semiconductor device including the storage node contact 138. As illustrated in FIG. 27, a first width of the upper portion of the storage node contact 138 along the first direction is wider than a second width of the upper portion of the storage node contact 138 along the second direction.

Figure 42:
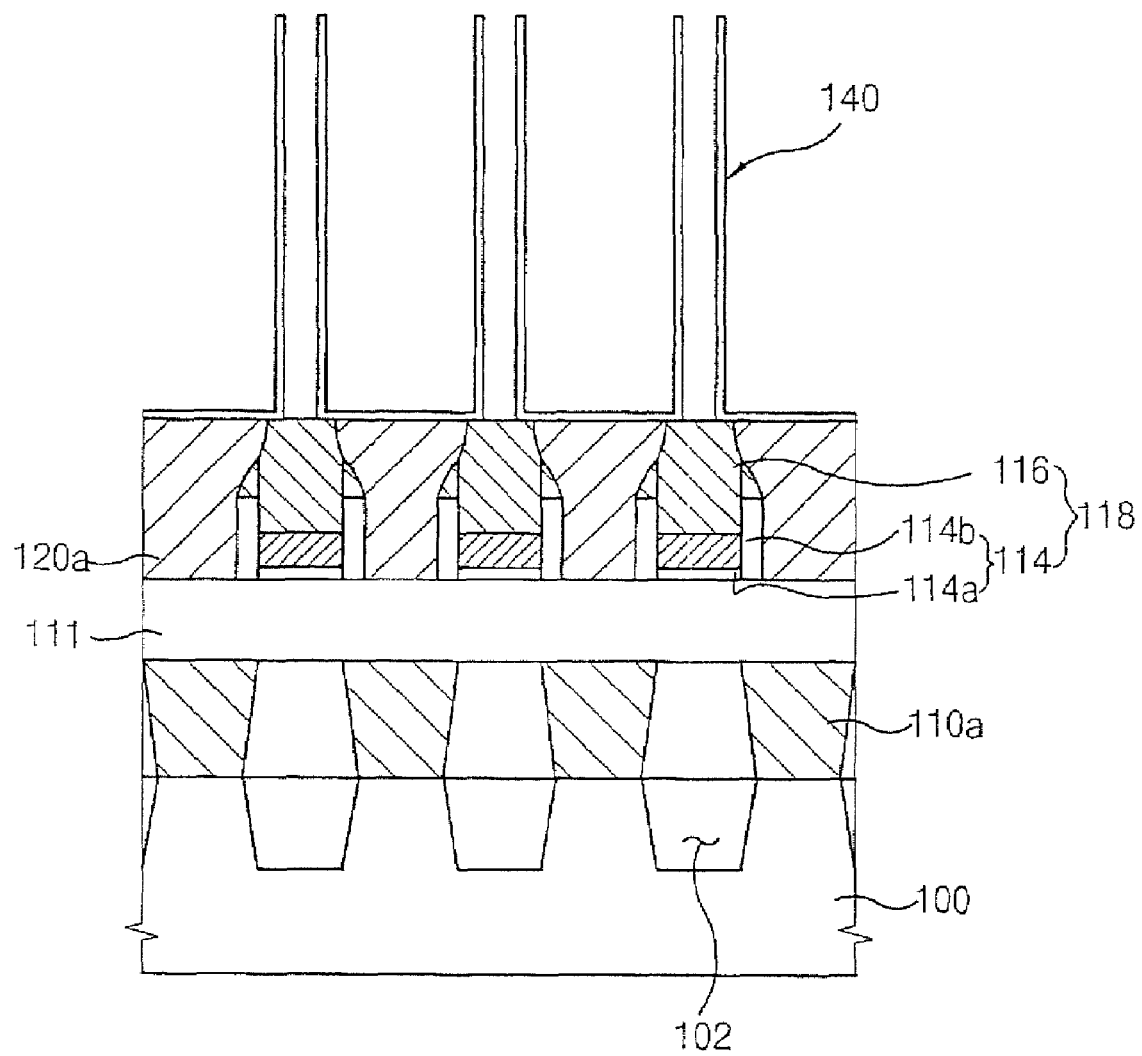
Figure 43:
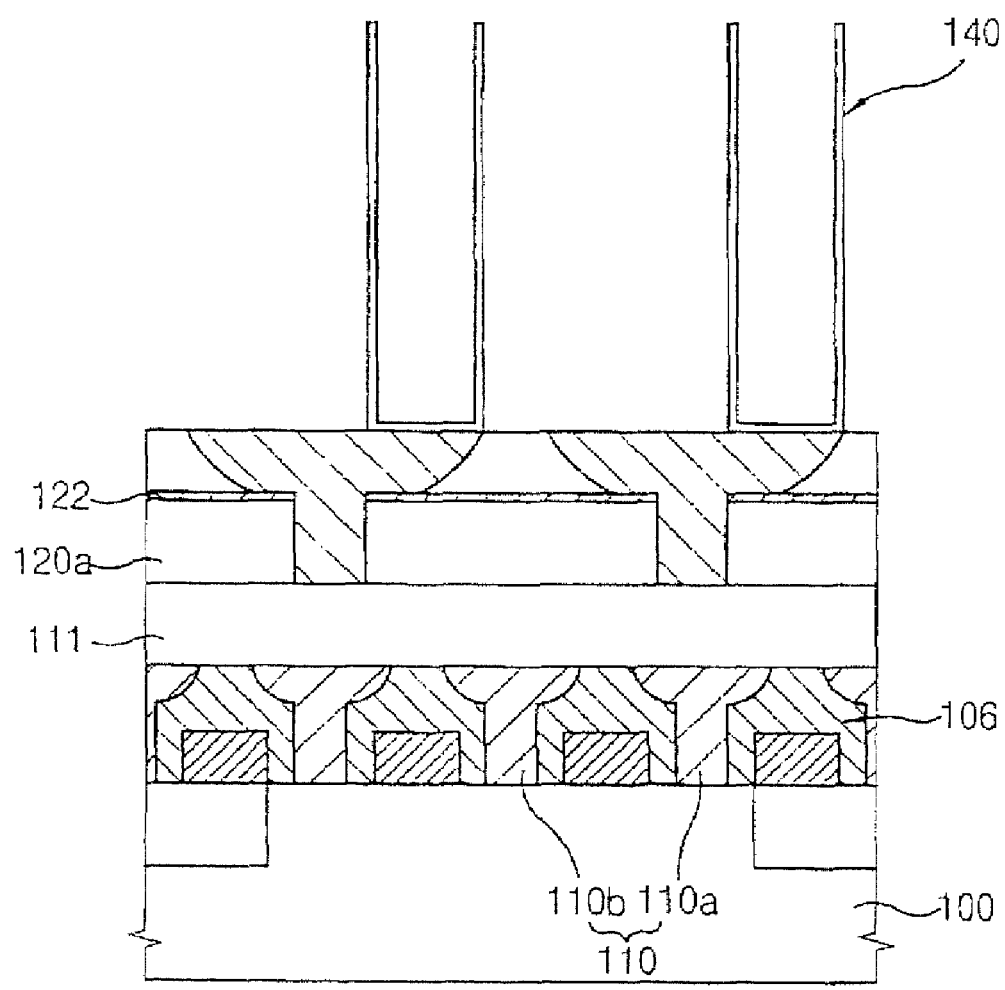

Referring to FIGS. 42 and 43, a storage electrode 140 is formed on a predetermined portion of the storage node contact 138. The storage electrode 140 may have a cylindrical shape. Particularly, a mold layer is formed on the storage node contact 138 and on the third insulating interlayer 124. The mold layer may include an oxide such as borophosphosilicate glass (BPSG), tetraethylorthosilicate (TEOS), etc. A predetermined portion of the mold layer is etched to form an opening partially exposing the upper face of the storage node contact 138. Then, a doped polysilicon layer is formed on a surface of the opening and on the mold layer. A sacrificial layer is formed on the polysilicon layer to fill the opening. The sacrificial layer may include undoped silicon glass (USG). The polysilicon layer on the mold layer is removed by a chemical mechanical polishing process. Then, the sacrificial layer and the mold layer are removed by an isotropic etching process to form the storage electrode 140. As the upper portion of the storage node contact 138 is enlarged, an area for forming the storage electrode 140 on the storage node contact 138 may be extended.

FIG. 20 is a plane view illustrating a semiconductor device including the storage electrode. Referring to FIGS. 20 and 42, the storage electrodes 140 are formed on predetermined portions of the upper faces of the storage node contacts 138. In particular, the storage electrodes 140 are formed on positions that are shifted along the first direction from centers of the upper faces of the storage node contacts. The storage electrodes 140 are disposed in a slant direction relative to the first or second direction. Thus, intervals between the storage electrodes 140 may be augmented.

A dielectric layer is formed on inner walls, a bottom face and outer walls of the storage electrode 140, and then a plate electrode is formed on the dielectric layer.

Figure 44:
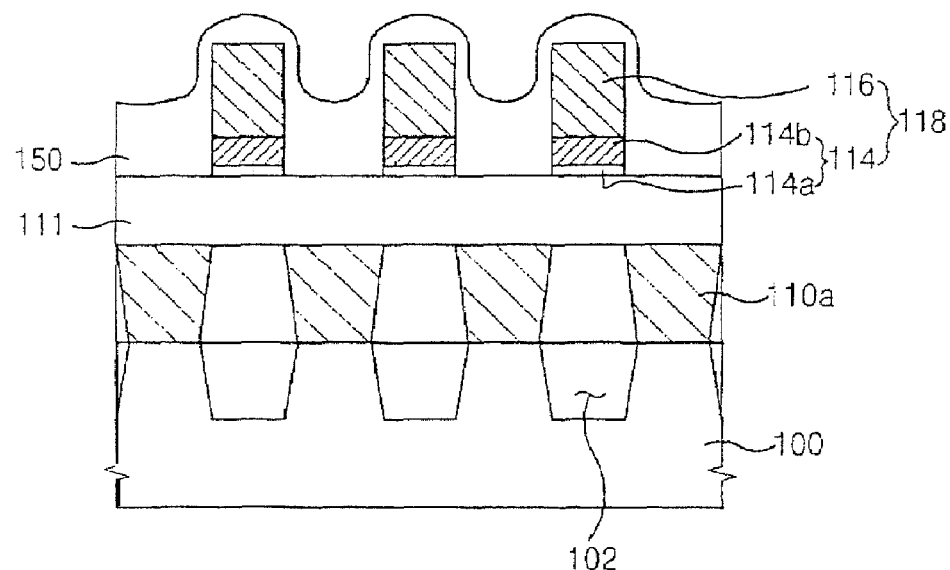
FIGS. 44 and 45 are cross sectional views illustrating methods of manufacturing a DRAM device in accordance with some embodiments of the present invention.
Figure 45:
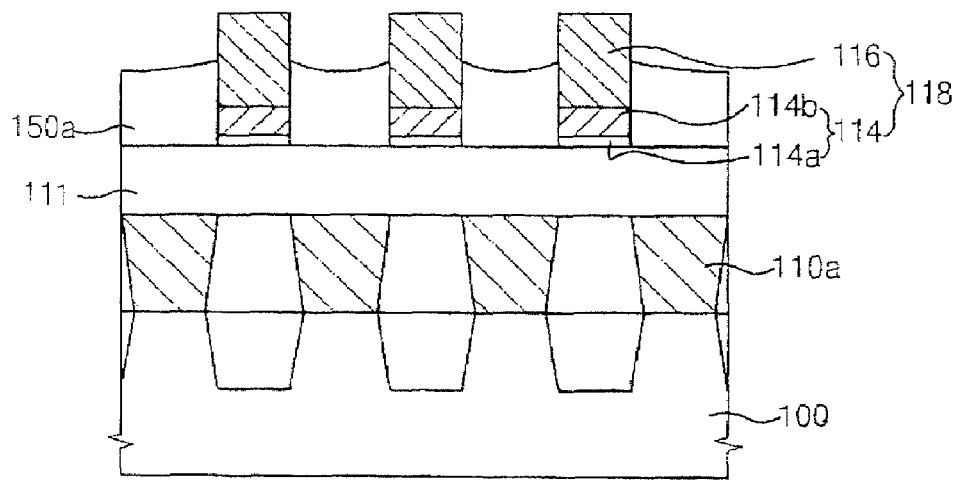

FIGS. 44 and 45 are cross sectional views illustrating methods of forming a DRAM device including a contact plug in accordance with some embodiments of the present invention. Here, FIGS. 44 and 45 are cross sectional views taken a line substantially perpendicular to the bit line.

Referring to FIG. 44, an insulation layer 150 is formed on the substrate 100 to partially cover a bit line structures 118. The insulation layer 150 may include a material having a dielectric constant lower than silicon nitride. An upper face of the silicon oxide layer 150 is substantially equal to or higher than that of a conductive layer pattern 114 of the bit line structures 118.

Referring to FIG. 45, the insulation layer 150 is etched by an isotropic etching process to form an insulation layer pattern 150a that partially covers the bit line structures 118. Here, the insulation layer 150 on upper portion of sidewalls and on upper faces of the bit line structures 118 is removed through the isotropic etching process. An upper face of the insulation layer pattern 150a is substantially equal to or higher than those of the conductive layer patterns 114 of the bit line structures 118.

When the insulation layer pattern 150a is formed using some methods of the present embodiment, the process for forming a contact plug may be simplified. Then, the DRAM device is completed using a substantially identical method illustrated in FIGS. 31 to 43.

Figure 46:
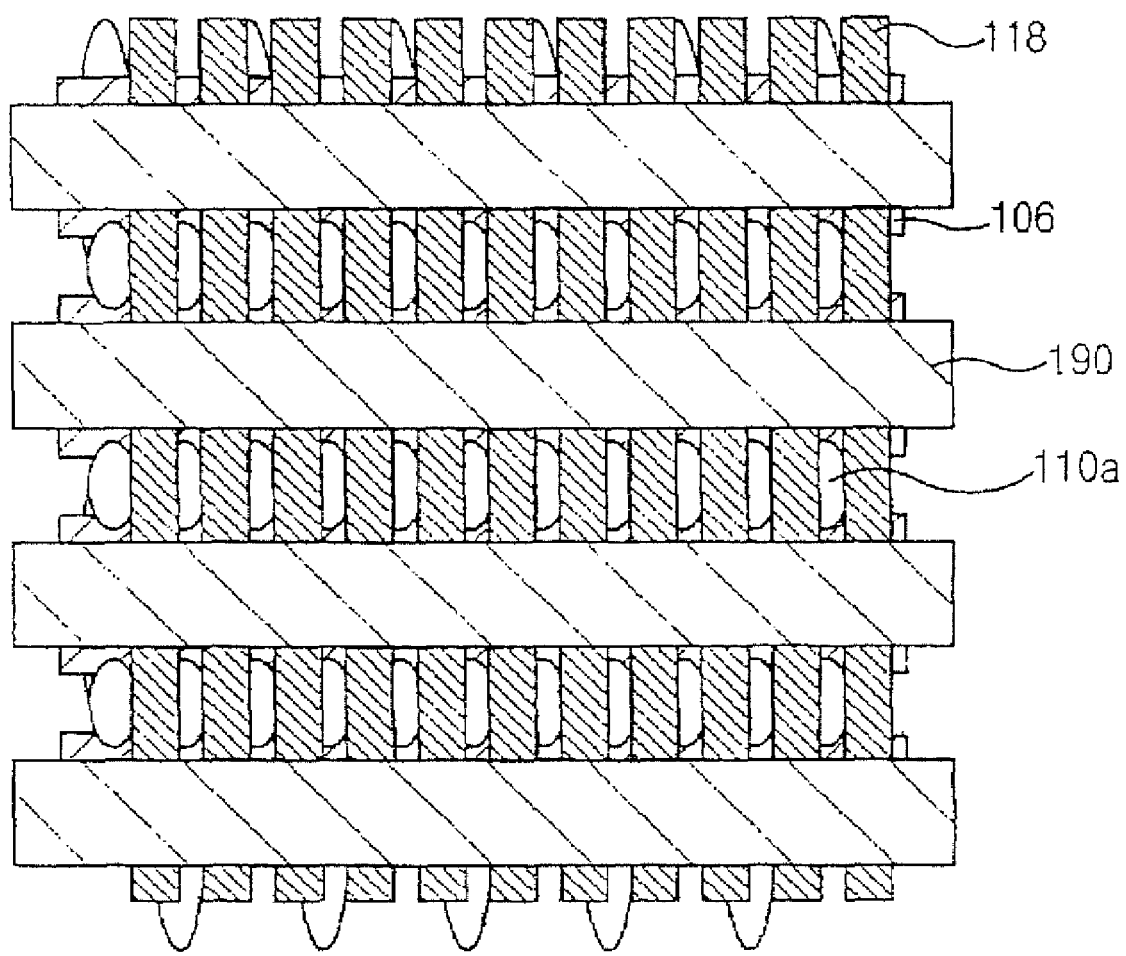
FIG. 46 is a plane view illustrating methods of manufacturing a DRAM device in accordance with some embodiments of the present invention.
Figure 47:
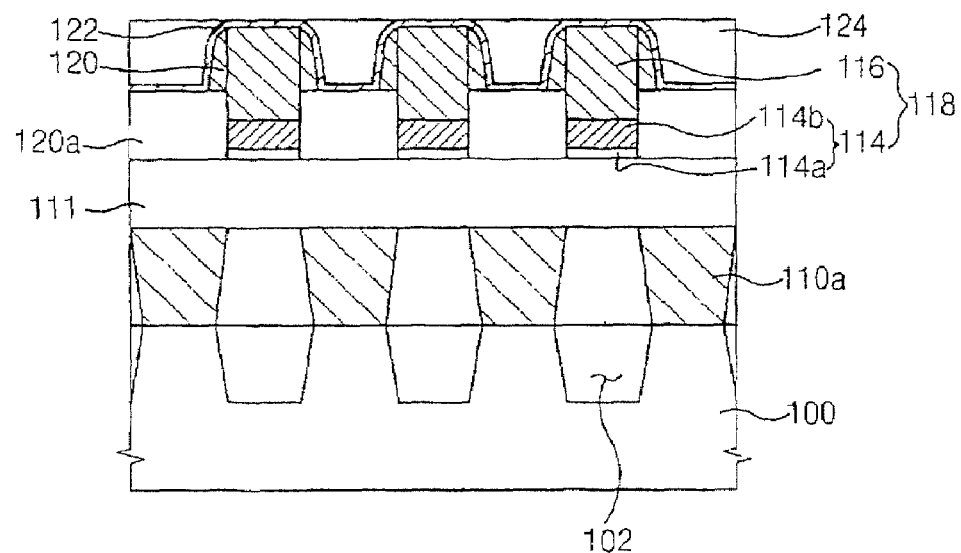
FIGS. 47 to 49 are cross sectional views illustrating methods of manufacturing the DRAM device in FIG. 46, in accordance with some embodiments of the present invention.
Figure 48:
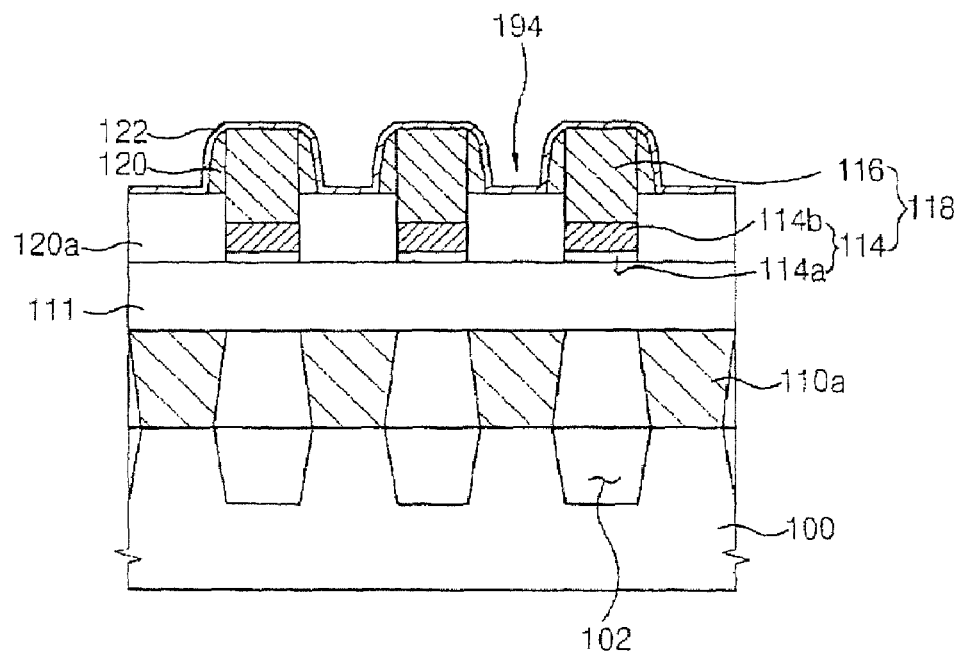
Figure 49:
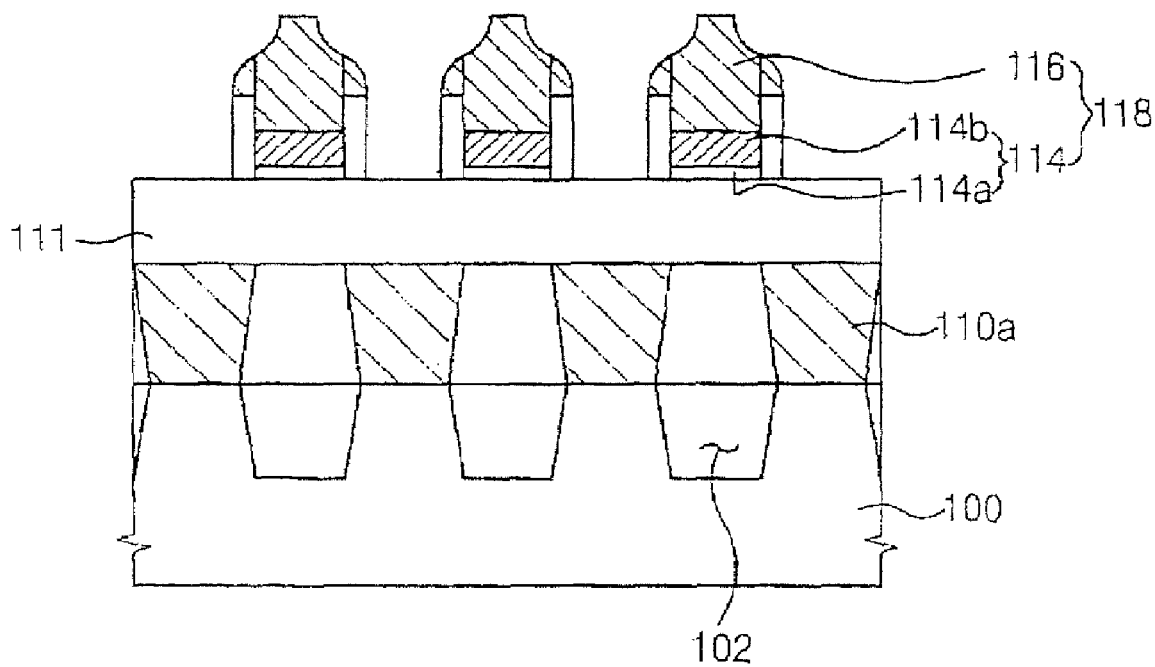

FIG. 46 is a plane view illustrating methods of forming a DRAM device including a contact plug in accordance with some embodiments of the present invention. FIGS. 47 to 49 are cross sectional views illustrating methods of forming the DRAM device including the contact plug in accordance with some embodiments of the present embodiment. Here, FIGS. 47 to 49 are cross sectional views taken a line along a second direction. The second direction is substantially perpendicular to a bit line, and a first direction is substantially parallel to the bit line.

Referring to FIGS. 47 and 48, a third insulating interlayer 124 is formed on a substrate 100 including underlying structures. The underlying structures may be formed using a method substantially identical to methods illustrated in FIGS. 22 to 25, and FIGS. 28 to 33. A second photoresist pattern for forming a storage node contact hole is formed on the third insulating interlayer. The second photoresist pattern may have a line shape. In particular, opened portions of the second photoresist pattern correspond to first contact pads 110a. The third insulating interlayer 124 is partially etched using the second photoresist pattern as an etching mask to form first openings 104 having trench shapes. As illustrated in FIG. 48, when the etching process is carried out, the third insulating interlayer 124 on the bit line structures 118 without the second photoresist pattern formed thereon is simultaneously removed. When the second photoresist pattern is formed having a line shape, a photolithography process is easily performed so that a contact having a very small width may be formed.

Referring to FIG. 49, sidewalls and bottom faces of the first openings 194 are etched to form second openings having lager upper portions than those of the first openings 194. That is, the second openings 132 are formed by extending the first openings 130 through an etching process. The etching process may be an isotropic etching process. The second openings 132 may be formed by a wet etching process. Here, the third insulating interlayer 124 formed on the bit line structures 118 is completely removed. The bottom faces of the second openings are higher than that of the insulation layer pattern 120a. The second openings are separated from each other by a predetermined interval. Upper portions of the second openings may be effectively extended along the first direction by performing a wet etching process. However, as the spacers 120 are formed on the upper sidewalls of the bit line structures 118, the upper portions of the second openings 132 may not be extended along the second direction that is substantially perpendicular to the first direction. The third insulating interlayer is also etched along a perpendicular direction relative to the surface of the substrate 100.

The etching stop layer, the insulation layer pattern and the second insulating interlayer 111 under the second openings are successively etched using the second photoresist pattern as an etching mask to form third openings. The third openings correspond to the opened portions of the second photoresist pattern 126, and may be self-aligned by the bit line structures 118. Upper portions of the third openings have smaller sizes than those of the second openings. Then, the DRAM device is completed using a substantially identical methods illustrated in FIGS. 31 to 43.

As described above, a contact plug having an enlarged upper portion, and which is larger than a lower portion thereof may be formed. Enlarging the upper portion of the contact plug may increase an alignment margin for patterns that are subsequently formed thereon. Moreover, the spacing between capacitors that are formed on a storage node contact may be increased. Parasitic capacitance may be effectively reduced by using an insulation layer pattern between the storage node contacts and bit line structures that includes a material having a relatively low dielectric constant.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. A semiconductor device comprising:
   a substrate;
   conductive structures on the substrate, each of the conductive structures having a line shape along a first direction parallel to the substrate, wherein each of the conductive structures includes a conductive layer pattern and a capping layer pattern on the conductive layer pattern;
   insulating spacers partially covering upper sidewalls of the conductive structures;
   an insulation structure on the conductive structures, wherein the insulation structure includes an insulation layer pattern partially covering lower sidewalls of the conductive structures, and the insulating layer pattern extends further away from the substrate than the conductive layer pattern; and
   contact plugs between adjacent pairs of the conductive structures, wherein each of the contact plugs extend from an upper surface of the insulating structure through the insulating structure to be electrically connected to a portion of the substrate, an upper portion of each of the contact plugs is substantially larger than a lower portion thereof, an upper face of each of the contact plugs has a first width along the first direction and a second width along a second direction parallel to the substrate and substantially perpendicular to the first direction, and the first width is substantially larger than the second width.

2. The semiconductor device of claim 1, wherein the conductive layer pattern comprises metal.

3. The semiconductor device of claim 1, wherein the insulation structure further comprises:
   an insulating interlayer on the insulation layer pattern, the insulating interlayer completely covering sidewalls of the conductive structures.

4. The semiconductor device of claim 1, wherein the insulation layer pattern comprises material having a lower dielectric constant than that of the insulating spacers.

5. The semiconductor device of claim 1, wherein the insulation layer pattern comprises silicon oxide, and the insulating spacers comprise silicon nitride.

6. A semiconductor device comprising:
   a substrate with active patterns therein;
   a first insulating interlayer on the substrate;
   bit line structures on the first insulating interlayer, wherein the bit line structures extend along a first direction parallel to the substrate, and wherein each of the bit line structures includes a bit line of a conductive material and a capping layer pattern on the bit line;
   insulating spacers partially covering upper sidewalls of the bit line structures;
   an insulation structure on the bit line structures, wherein the insulation structure includes an insulation layer pattern partially covering lower sidewalls of the bit line structures, and the insulating layer pattern extends further away from the substrate than the bit line;
   storage node contacts between adjacent pairs of the bit line structures, wherein each of the storage node contacts extend from an upper surface of the insulating structure through the insulating structure to be electrically connected to the active patterns in the substrate, an upper portion of each of the storage node contacts is substantially larger than a lower portion thereof, an upper face of each of the storage node contacts has a first width along the first direction and a second width along a second direction parallel to the substrate and substantially perpendicular to the first direction, and the first width is substantially larger than the second width; and
   capacitors, each on a portion of the upper face of each of the storage node contacts.

7. The semiconductor device of claim 6, wherein the insulation structure further comprises:
   an insulating interlayer on the insulation layer pattern.

8. The semiconductor device of claim 6, wherein the insulation layer pattern comprises material having a lower dielectric constant than that of the insulating spacers.

9. The semiconductor device of claim 6, wherein the bit line structures comprise metal.

10. The semiconductor device of claim 6, further comprising word line structures that extend along the second direction in the first insulating interlayer.

11. The semiconductor device of claim 10, wherein pairs of the word line structures overlie each of the active patterns.

12. The semiconductor device of claim 10, further comprising contact pads extending from an upper surface of the first insulating interlayer through the first insulating layer to be electrically connected to the active patterns between the word lines.

13. The semiconductor device of claim 6, wherein the capacitors are arranged in a slant direction relative to the first and second directions.

* * * * *